United States Patent
Ong

(10) Patent No.: US 9,099,181 B2
(45) Date of Patent: Aug. 4, 2015

(54) NON-VOLATILE STATIC RAM CELL CIRCUIT AND TIMING METHOD

(75) Inventor: Adrian E. Ong, Pleasanton, CA (US)

(73) Assignee: GRANDIS, INC., Milpitas, CA (US)

( * ) Notice: Subject to any disclaimer, the term of this patent is extended or adjusted under 35 U.S.C. 154(b) by 1232 days.

(21) Appl. No.: 13/011,726

(22) Filed: Jan. 21, 2011

(65) Prior Publication Data

US 2012/0020159 A1 Jan. 26, 2012

Related U.S. Application Data

(60) Provisional application No. 61/363,576, filed on Jul. 12, 2010.

(51) Int. Cl.
*G11C 14/00* (2006.01)

(52) U.S. Cl.
CPC .......... *G11C 14/0081* (2013.01); *G11C 14/009* (2013.01); *G11C 14/0063* (2013.01); *G11C 14/0072* (2013.01); *Y10T 29/49117* (2015.01)

(58) Field of Classification Search
CPC .......................... G11C 14/0081; G11C 14/009
See application file for complete search history.

(56) References Cited

U.S. PATENT DOCUMENTS

| | | | |
|---|---|---|---|
| 6,421,293 B1 | 7/2002 | Candelier et al. | |
| 6,552,928 B1 | 4/2003 | Qi et al. | |
| 6,590,825 B2 | 7/2003 | Tran et al. | |
| 6,842,361 B2 | 1/2005 | Miyatke et al. | |
| 7,394,685 B2 | 7/2008 | Ooishi et al. | |
| 7,539,054 B2 * | 5/2009 | Ashokkumar et al. ... | 365/185.07 |
| 7,599,210 B2 * | 10/2009 | Okazaki et al. ............... | 365/148 |
| 7,692,954 B2 * | 4/2010 | Lamorey ........................ | 365/154 |
| 7,742,329 B2 | 6/2010 | Yoon et al. | |
| 7,936,592 B2 | 5/2011 | Wang et al. | |
| 8,174,872 B2 * | 5/2012 | Sakimura et al. ............. | 365/158 |
| 8,331,134 B2 * | 12/2012 | Chiu et al. ..................... | 365/154 |
| 8,537,597 B2 * | 9/2013 | Kushida ........................ | 365/148 |
| 8,605,490 B2 * | 12/2013 | Fackenthal .................... | 365/154 |
| 8,624,218 B2 * | 1/2014 | Chen ................................. | 257/4 |
| 2008/0180992 A1 | 7/2008 | Yamane et al. | |
| 2008/0189588 A1 | 8/2008 | Tanaka et al. | |
| 2008/0215954 A1 | 9/2008 | Oshikiri | |
| 2008/0225590 A1 * | 9/2008 | Lamorey .................. | 365/185.05 |
| 2009/0147562 A1 | 6/2009 | Clinton et al. | |
| 2010/0080042 A1 | 4/2010 | Lamorey | |

OTHER PUBLICATIONS

International Search Report dated Nov. 9, 2011 issued in International Application No. PCT/US/11/42978.

* cited by examiner

*Primary Examiner* — Harry W Byrne
*Assistant Examiner* — Lance Reidlinger
(74) *Attorney, Agent, or Firm* — Renaissance IP Law Group LLP

(57) ABSTRACT

A non-volatile static random access memory cell and includes a bistable regenerative circuit coupled to first and second transistors and to first and second non-volatile memory cells. Methods of use include directly transferring a complementary data bit between the non-volatile memory cell and the bistable regenerative circuit. Alternatively, complementary data from the bistable regenerative circuit may be regenerated by a sense amplifier and a second bistable regenerative circuit before being transferred to non-volatile memory cells in a column of memory cells. The bistable regenerative circuit may be reset to ground potential. Applications using the non-volatile SRAM cell with direct read out from the bistable regenerative circuit include a non-volatile flip-flop or non-volatile multiplexer.

6 Claims, 15 Drawing Sheets

NON-VOLATILE STATIC RAM CELL CIRCUIT AND TIMING METHOD

CROSS-REFERENCES TO RELATED APPLICATIONS

The present application claims benefit under 35 USC 119 (e) of U.S. provisional application No. 61/363,576, filed Jul. 12, 2010, entitled "Non-Volatile Static Ram Cell Circuit and Timing Method," the content of which is incorporated herein by reference in its entirety.

This application is related to commonly assigned application Ser. No. 61/352,306, filed Jun. 7, 2010, entitled "MULTI-SUPPLY SYMMETRIC DRIVER CIRCUIT AND TIMING METHOD"; commonly assigned application Ser. No. 12/558,451, filed Sep. 11, 2009, entitled "DIFFERENTIAL READ AND WRITE ARCHITECTURE"; and commonly assigned application Ser. No. 12/544,189, filed Aug. 19, 2009, entitled "DYNAMIC MULTISTATE MEMORY WRITE DRIVER," the contents of all of which are incorporated herein by reference in their entirety.

BACKGROUND OF THE INVENTION

The present invention relates to memory integrated circuits, and more particularly to a non-volatile static random access memory.

Semiconductor memory devices have been widely used in electronic systems to store data. There are generally two types of semiconductor memories, including non-volatile and volatile memories. A volatile memory device, such as a Static Random Access Memory (SRAM) or a Dynamic Random Access Memory (DRAM) device, loses its data when the power applied to it is turned off. In contrast, a non-volatile semiconductor memory device, such as a Flash Erasable Programmable Read Only Memory (Flash EPROM) or a magnetic random access memory (MRAM), retains its charge even after the power applied thereto is turned off. Therefore, where loss of data due to power failure or termination is unacceptable, a non-volatile memory is used to store the data.

FIG. 1A is a simplified cross-sectional view of a magnetic tunnel junction (MTJ) structure 10 used in forming a spin transfer torque (STT) MRAM cell. MTJ 10 is shown as including, in part, a reference layer 12, a tunneling layer 14, and a free layer 16. Reference layer 12 and free layer 16 are ferromagnetic layers. Tunneling layer 14 is a nonmagnetic layer. The direction of magnetization of reference layer 12 is fixed and does not change. The direction of magnetization of free layer 16, however, may be varied by passing a sufficiently large current through the MTJ structure. In FIG. 1A, reference layer 12 and free layer 16 are assumed to have the same magnetization direction, i.e., they are in a parallel state. In FIG. 1B, reference layer 12 and free layer 16 are assumed to have opposite magnetization directions, i.e., they are in an anti-parallel state. In FIG. 1C, reference layer 12 and free layer 16 are assumed to have the same magnetization direction perpendicular to a plane defined by the interface of free layer 16 and tunneling layer 14. In FIG. 1D, reference layer 12 and free layer 14 are assumed to have opposite magnetization directions perpendicular to a plane defined by the interface of free layer 16 and tunneling layer 14.

To switch from the parallel state, as shown in FIG. 1A, to the anti-parallel state, as shown in FIG. 1B, the voltage potential of reference layer 12 is increased relative to that of free layer 16. This voltage difference causes spin polarized electrons flowing from free layer 16 to reference layer 12 to transfer their angular momentum and change the magnetization direction of free layer 16 to the anti-parallel state, as shown in FIG. 1B. To switch from the anti-parallel state to the parallel state, the voltage potential of free layer 16 is increased relative to that of reference layer 12. This voltage difference causes spin polarized electrons flowing from reference layer 12 to free layer 16 to transfer their angular momentum and change the magnetization direction of free layer 16 to the parallel state, as shown in FIG. 1A.

To switch from the parallel state to the non-parallel state or vice versa, the voltage applied to MTJ 10 and the corresponding current flowing through MTJ must be greater than a respective pair of threshold values. The voltage that must exceed a threshold voltage in order for the switching to occur is also referred to as the switching voltage $V_c$. Likewise, the current that must exceed a threshold current in order for the switching to occur is referred to as the switching current $I_c$. As is well known, when free layer 16 and reference layer 12 have the same magnetization direction (parallel state), MTJ 10 has a relatively low resistance. Conversely, when free layer 16 and reference layer 12 have the opposite magnetization direction (anti-parallel state), MTJ 10 has a relatively high resistance. Due to the physical properties of an MTJ, the critical current required to change the state of an MTJ from a parallel to an anti-parallel is often greater than the critical current required to change the state of the MTJ from an anti-parallel to a parallel state.

FIG. 2A shows an MTJ 10 and an associated select transistor 20 together forming an STT-MRAM cell 30. Transistor 20 is often an NMOS transistor due to its inherently higher current drive, lower threshold voltage, and smaller area relative to a PMOS transistor. As is described further below, the current used to write a "1" in MRAM 30 is different than the current used to write a "0". The asymmetry in the direction of current flow during these two write conditions is caused by the asymmetry in the gate-to-source voltage of transistor 20. Accordingly, a write driver circuit adapted to deliver sufficient current to write a "0", may not be able to provide enough current to write a "1". Similarly, a write driver circuit adapted to deliver sufficient current to write a "1" may deliver a current that is greater than what would otherwise be an acceptable current level to write a "0".

In the following description, an MRAM cell is defined as being in a logic "0" state when the free and reference layers of its associated MTJ are in a parallel (P) state, i.e., the MTJ exhibits a low resistance. This low resistance state is also alternatively shown as $R_{low}$, or $R_P$ state Conversely, an MRAM cell is defined as being in a logic "1" state when the free and reference layers of its associated MTJ are in an anti-parallel (AP) state, i.e., the MTJ exhibits a high resistance. This high resistance state is also alternatively shown as $R_{high}$ or $R_{AP}$ state. Furthermore, in the following, it is assumed that the reference layer of the MTJ faces its associated select transistor, as shown in FIG. 2A. Therefore, in accordance with the discussion above, a current flowing along the direction of arrow 35 (the up direction) (i) either causes a switch from the P state to the AP state thus to write a "1", (ii) or stabilizes the previously established AP state of the associated MTJ. Likewise, a current flowing along the direction of arrow 40 (the down direction) (i) either causes a switch from the AP state to the P state thus to write a "0", (ii) or stabilizes the previously established P state of the associated MTJ. It is understood, however, that in other embodiments this orientation may be reversed so that the free layer of the MTJ faces its associated select transistor. In such embodiments (not shown), a current flowing along the direction of arrow 35 (i) either causes a switch from the AP state to the P, (ii) or stabilizes the previously established P state of the associated MTJ. Likewise, in such embodiments, a current flowing along the direction of arrow 40 (i) either causes a switch from the P state to the AP state, (ii) or stabilizes the previously established AP state. FIG. 2B is a schematic representation of MRAM 30 of FIG. 2A in which MTJ 10 is shown as a storage element whose resistance varies depending on the data stored therein. The MTJ changes its state (i) from P to AP when the current flows along arrow 35, and (ii) from AP to P when the current flows along arrow 40.

As described above, the voltage required to switch an MTJ from an AP state to a P state, or vice versa, must exceed a critical value Vc. The current corresponding to this voltage is referred to as the critical current Ic. FIG. 3 represents the variation in the MTJ state (or its resistance) during various write cycles. To transition from the P state (low resistance state) to AP state (high resistance state), a positive voltage of Vc is applied. Once in the AP state, removing the applied voltage does not affect the state of the MTJ. Likewise, to transition from the AP state to the P state, a negative voltage of Vc is applied. Once in the P state, removing the applied voltage does not affect the state of the MTJ. The resistance of the MTJ is $R_{high}$ when it is in AP state and receives no or very small voltage. Likewise, the resistance of the MTJ is $R_{low}$, when it is in P state and receives no or very small voltage.

FIG. 4A shows an MTJ 10 being programmed to switch from an anti-parallel state (i.e., high resistance state, or logic "1" state) to a parallel state so as to store a "0" (i.e., low resistance state, or logic "0" state). It is assumed that MTJ 10 is initially in a logic "1" or AP state. As described above, to store a "0", a current $I_c$ greater than the critical current is caused to flow through transistor 20 in the direction of arrow 40. To achieve this, the source node (SL) of transistor 20 is coupled to the ground potential via a resistive path (not shown), a positive voltage Vpp is applied to the gate node (WL or wordline) of transistor 20, and a positive voltage $V_{cc}$ is applied to the drain node (BL or bitline) of transistor 20.

FIG. 5 is an exemplary timing diagram of the voltage levels at nodes WL, SL, SN and BL during write "0" operation, occurring approximately between times 25 ns and 35 ns, and write "1" operation, occurring approximately between times 45 ns and 55 ns, for a conventional MTJ such as MTJ 10 shown in FIGS. 4A and 4B. Supply voltage $V_{CC}$ is assumed to be 1.8 volts. Signal WL as well as signal CS which is a column select signal are shown as having been boosted to a higher Vpp programming voltage of 3.0 volts. During the write "0" operation, the voltages at nodes BL, SL and SN are shown as being approximately equal to 1.43 V, 0.34 V, and 0.88 V respectively. During the write "1" operation, the voltages at nodes BL, SL and SN are shown as being approximately equal to 0.23 V, 1.43 V, and 0.84 V respectively. Although not shown, for this exemplary computer simulation, the currents flowing through the MTJ during write "0" and "1" operations are respectively 121 µA and 99.2 µA.

FIG. 4B shows an MTJ being programmed to switch from a parallel state to an anti-parallel state so as to store a "1". It is assumed that MTJ 10 is initially in a logic "0" or P state. To store a "1", a current L greater than the critical current is caused to flow through transistor 20 in the direction of arrow 35. To achieve this, node SL is supplied with the voltage $V_{cc}$ via a resistive path (not shown), node WL is supplied with the voltage Vpp, and node BL is coupled to the ground potential via a resistive path (not shown). Accordingly, during a write "1" operation, the gate-to-source voltage of transistor 20 is set to $(V_{WL}-V_{SN})$, and the drain-to-source voltage of transistor 20 is set to $(V_{SL}-V_{SN})$.

Because the gate-to-source and drain-to-source voltages of transistor 20 are higher under the conditions described with reference to FIGS. 4A and 5 than they are under the conditions described with reference to FIGS. 4B and 5, the corresponding current flow through the MTJ is higher when attempting to write a logic "0" than a logic "1". Accordingly, the voltages designed to generate the critical current needed to carry out a write "0" operation may not be sufficient to carry out a write "1" operation. An undesirable asymmetry thus exists in the current levels during write "1" and write "0" operations. Consequently, a transistor size selected to provide sufficient current to write a "0" may not provide enough current to write a "1". Alternatively, a larger transistor size selected to provide the required current to write a "1", may result in generation of excessive current when writing a "0". Such as excess current may damage the tunneling layer of the MTJ shown in FIG. 1.

SRAM has been used extensively for memory applications where data is to be read and written at high speed. FIG. 6A shows a six transistor (6T) SRAM cell where data is stored on a bi-stable latch or flip-flop formed simply by two cross coupled inverters. When power is applied, the output of one inverter drives the input of the other inverter and visa versa. If the output of one inverter, for example the inverter oriented with its output to the right in FIG. 6A, is at a high logic level then that high level is applied to the input of the other inverter whose output is driven low on the left side of FIG. 6A. The latch or flip-flop circuit will hold this condition as long as power is applied. A single bit of data is thus stored depending on which inverter is driving a low level on the left or on the right side of the latch while the complementary high logic level is driven on the right or on the left side of the latch respectively. In other words, the signal terminal at the left side of the latch will hold the complement data state of the signal terminal on the right side of the latch. The size of the devices used for the latch are small so that the current drive capability of the inverters is small and also to minimize chip area when the cell is arrayed in a memory organized in rows and columns. The state of the latch can thus be easily changed by forcing the opposite state on the two sides of the latch. Transistor sizing for the 6-T SRAM cell is well understood in the industry. In general, the access pass gate should be sized such that it is large enough to overcome the cross-coupled PMOS and NMOS transistors during a write, but small enough to prevent read disturbs. The cross-coupled NMOS devices are typically stronger than the PMOS devices. But final sizing depends on the relative strength of the PMOS and NMOS devices.

The complementary outputs of each inverter in the latch shown in FIG. 6A are coupled through n-channel pass gates to complementary bit lines, BL and BLB. The pass gates are controlled by the word line signal (WL) which may be generated by a row, y-decoder or other logic. When the WL is selected, the latch is coupled to the BL and BLB signals through the pass transistors. During read operation the data on the BL and BLB signals is driven by the latch and can be sensed by a sense amplifier or other circuitry. During write operation, data on the BL and BLB signals is driven by external circuitry to the desired complementary logic levels which forces the state of the latch to store that data. When the WL is deselected, the pass transistors isolate the latch from the BL and BLB signals and the data remains stored on the latch. If power to the latch is removed or interrupted for a sufficiently long time, the data stored on the latch is corrupted or lost so the SRAM is called a volatile memory. FIG. 6B shows the same circuit as FIG. 6A except the inverters forming the latch are implemented in CMOS logic and known as a six transistor (6T) CMOS SRAM cell.

BRIEF SUMMARY OF THE INVENTION

In accordance with one embodiment of the present invention, a non-volatile static random access memory cell includes, in part, a bistable regenerative circuit, first and second transistors and first and second non-volatile memory cells. The first transistor includes a first current carrying terminal coupled to a first terminal of the bistable regenerative circuit and a second current carrying terminal coupled to a first signal line. The second transistor includes a first current carrying terminal coupled to a second terminal of the bistable regenerative circuit, and a second current carrying terminal coupled to a second signal line. The first non-volatile memory cell includes a first current carrying terminal coupled to the first terminal of the bistable regenerative circuit. The second non-volatile memory cell includes a first current carrying terminal coupled to the second terminal of the bistable regenerative circuit. The first and second non-volatile memory cells have their control terminals coupled to a third signal line and their gate terminals coupled to a fourth signal line.

In some embodiments, the first non-volatile memory cell includes, in part, a second current carrying terminal that is coupled to a fifth signal line. The second non-volatile memory cell includes, in part, a second current carrying terminal coupled to a sixth signal line. In another embodiment, the first non-volatile memory cell includes, in part, a second current carrying terminal that is coupled to the first signal line. The second non-volatile memory cell includes, in part, a second current carrying terminal coupled to the second signal line. In another embodiment, the second current carrying terminals of the first and second non-volatile memory cells are coupled to a fifth signal line.

In one embodiment, the non-volatile static random access memory cell further includes, in part, third and fourth transistors. The third transistor includes, in part, a first current carrying terminal coupled to the second terminal of the bistable regenerative circuit and a second current carrying terminal coupled to a fifth signal line. The fourth transistor includes, in part, a first current carrying terminal coupled to the first terminal of the bistable regenerative circuit and a second current carrying terminal coupled to the fifth signal line. The gate terminals of the third and fourth transistors are coupled to a sixth signal line.

In some embodiments, the first and second non-volatile memory cells further include, in part, first and second magnetic tunnel junctions and third and fourth transistors. The first magnetic tunnel junction includes, in part, a first terminal coupled to a second current carrying terminal of the first non-volatile memory cell. The third transistor includes, in part, a first current carrying terminal coupled to the first current carrying terminal of the first non-volatile memory cell. The third transistor further includes, in part, a gate terminal coupled to the control terminal of the first non-volatile memory cell and a second current carrying terminal coupled to a second terminal of the first magnetic tunnel junction. The second magnetic tunnel junction includes, in part, a first terminal coupled to a second current carrying terminal of the second non-volatile memory cell. The fourth transistor includes, in part, a first current carrying terminal coupled to the first current carrying terminal of the second non-volatile memory cell. The fourth transistor further includes, in part, a gate terminal coupled to the control terminal of the second non-volatile memory cell and a second current carrying terminal coupled to a second terminal of the second magnetic tunnel junction. In another embodiment, when the first magnetic tunnel junction stores a logical one, the second magnetic tunnel junction stores a logical zero, and when the first magnetic tunnel junction stores a logical zero, the second magnetic tunnel junction stores a logical one.

In accordance with one embodiment of the present invention, a non-volatile flip-flop includes, in part, first and second non-volatile static random access memory cells, each further including, in part, a bistable regenerative circuit, first and second transistors and first and second non-volatile memory cells. The first transistor includes a first current carrying terminal coupled to a first terminal of the bistable regenerative circuit, and a second current carrying terminal coupled to a first signal line. The second transistor includes a first current carrying terminal coupled to a second terminal of the bistable regenerative circuit, and a second current carrying terminal coupled to a second signal line. The first non-volatile memory cell includes a first current carrying terminal coupled to the first terminal of the bistable regenerative circuit. The second non-volatile memory cell includes a first current carrying terminal coupled to the second terminal of the bistable regenerative circuit. The control terminals of the first and second non-volatile memory cells are coupled to a third signal line. The gate terminals of the first and second transistors are coupled to a fourth signal line. The second current carrying terminals of the first and second non-volatile memory cells are coupled to a fifth signal line. A data input of the flip-flop is applied to the first signal line of the first non-volatile static random access memory cell. An inverse data input of the flip-flop is applied to the second signal line of the first non-volatile static random access memory cell. The first terminal of the first non-volatile static random access memory cell is coupled to the first signal line of the second non-volatile static random access memory cell. The second terminal of the first non-volatile static random access memory cell is coupled to the second signal line of the second non-volatile static random access memory cell. The first terminal of the second non-volatile static random access memory cell is coupled to a data output of the flip-flop, and the second terminal of the second non-volatile static random access memory cell is coupled to an inverse data output of the flip-flop.

In some embodiment, a clock signal is applied to the fourth signal line of the first non-volatile static random access memory cell and an inverse of the clock signal is applied to the fourth signal line of the second non-volatile static random access memory cell when a sixth signal line is disabled. The fourth signal lines of the first and second non-volatile static random access memory cells are coupled to a potential that disables current in the first and second transistors when the sixth signal line is enabled.

In some embodiment, the first and second non-volatile memory cells in each non-volatile static random access memory cell further include, in part, first and second magnetic tunnel junctions, and third and fourth transistors. The first magnetic tunnel junction includes, in part, a first terminal coupled to the second current carrying terminal of the first non-volatile memory cell. The third transistor includes, in part, a first current carrying terminal coupled to the first current carrying terminal of the first non-volatile memory cell. The third transistor also includes, in part, a gate terminal coupled to the control terminal of the first non-volatile memory cell and a second current carrying terminal coupled to a second terminal of the first magnetic tunnel junction. The second magnetic tunnel junction includes, in part, a first terminal coupled to the second current carrying terminal of the second non-volatile memory cell. The fourth transistor includes, in part, a first current carrying terminal coupled to the first current carrying terminal of the second non-volatile memory cell, a gate terminal coupled to the control terminal of the second non-volatile memory cell and a second current carrying terminal coupled to a second terminal of the second magnetic tunnel junction.

In accordance with one embodiment of the present invention, a non-volatile static random access memory cell includes, in part, a bistable regenerative circuit, first and second transistors and first and second non-volatile memory cells. The first transistor includes, in part, a first current carrying terminal coupled to a first terminal of the bistable regenerative circuit, and a second current carrying terminal coupled to a first signal line. The second transistor includes, in part, a first current carrying terminal coupled to a second terminal of the bistable regenerative circuit, and a second current carrying terminal coupled to a second signal line. The first non-volatile memory cell includes, in part, a first current carrying terminal coupled to the first signal line. The second non-volatile memory cell includes, in part, a first current carrying terminal coupled to the second signal line. The control terminals of the first and second non-volatile memory cells are coupled to a third signal line. The gate terminals of the first and second transistors are coupled to a fourth signal line. The second current carrying terminals of the first and second non-volatile memory cells are coupled to a fifth signal line.

In some embodiment, the non-volatile static random access memory cell further includes, in part, a second bistable regenerative circuit, and third and fourth transistors. The second bistable regenerative circuit includes, in part, a first terminal coupled to the first signal line, a second terminal coupled to the second signal line, a third terminal coupled to a sixth signal line, and a fourth terminal coupled to a seventh signal line. The third transistor includes, in part, a first current carrying terminal coupled to the first signal line and a second current carrying terminal coupled to an eighth signal line. The fourth transistor includes, in part, a first current carrying terminal coupled to the second signal line and a second current carrying terminal coupled to a ninth signal line. The gate terminals of the third and fourth transistors are coupled to the sixth signal line.

In accordance with one embodiment of the present invention, a method of forming a non-volatile static random access memory cell includes, in part, connecting a first terminal of a bistable regenerative circuit to a first current carrying terminal of a first transistor and to a first current carrying terminal of a first non-volatile memory cell. The method further includes, in part, connecting a second terminal of the bistable regenerative circuit to a first current carrying terminal of a second transistor and to a first current carrying terminal of a second non-volatile memory cell, connecting a second current carrying terminal of the first transistor to a first signal line, connecting a second current carrying terminal of the second transistor to a second signal line and connecting control terminals of the first and second non-volatile memory cells to a third signal line. The method further includes, in part, connecting gate terminals of the first and second transistors to a fourth signal line, connecting a second current carrying terminal of the first and second non-volatile memory cells to a fifth signal line, connecting a third terminal of the bistable regenerative circuit to a sixth signal line and connecting a fourth terminal of the bistable regenerative circuit to a seventh signal line.

In some embodiment, the method further includes, in part, providing a first data stored in the first terminal of the bistable regenerative circuit, and providing a logic complement of the first data stored in the second terminal of the bistable regenerative circuit. The first data and the logic complement of the first data are a complementary or differential data bit. The method further includes, in part, storing the first data directly in the first non-volatile memory cell and storing a logic complement of the first data directly in the second non-volatile memory cell. Thus, the complementary or differential data bit provided in the bistable regenerative circuit is directly stored in the first and second non-volatile memory cells.

In some embodiment, the method further includes, in part, providing a first data stored in the first non-volatile memory cell and providing a logic complement of the first data stored in the second non-volatile memory cell. The first data and the logic complement of the first data are a complementary or differential data bit. The method further includes, in part, storing the first data directly in the first terminal of the bistable regenerative circuit and storing the logic complement of the first data directly in the second terminal of the bistable regenerative circuit. Thus, the complementary or differential data bit provided in the first and second non-volatile memory cells is directly stored in the bistable regenerative circuit.

In accordance with one embodiment of the present invention, a non-volatile multiplexer includes, in part, a multitude of non-volatile static random access memory cells, a multitude of corresponding transistors, a bistable regenerative circuit, first and second transistors and first and second non-volatile memory cells. The multitude of corresponding transistors each include, in part, a first current carrying terminal coupled to a common signal line. Each non-volatile static random access memory cell further includes, in part, a bistable regenerative circuit, first and second transistors and; first and second non-volatile memory cells. The first transistor includes, in part, a first current carrying terminal coupled to a first terminal of the bistable regenerative circuit, and a second current carrying terminal coupled to a first signal line. The second transistor includes, in part, a first current carrying terminal coupled to a second terminal of the bistable regenerative circuit, and a second current carrying terminal coupled to a second signal line. The first non-volatile memory cell includes, in part, a first current carrying terminal coupled to the first terminal of the bistable regenerative circuit. The second non-volatile memory cell includes, in part, a first current carrying terminal coupled to the second terminal of the bistable regenerative circuit. The control terminals of the first and second non-volatile memory cells are coupled to a third signal line. The gate terminals of the first and second transistors are coupled to a fourth signal line. The second current carrying terminals of the first and second non-volatile memory cells are coupled to a fifth signal line. The first terminal of the bistable regenerative circuit in each of the multitude of non-volatile static random access memory cells is coupled to a corresponding gate terminal of each of the multitude of corresponding transistors. The second current carrying terminal of each of the multitude of corresponding transistors is coupled to a corresponding signal line.

In accordance with one embodiment of the present invention, a method of forming a non-volatile static random access memory cell includes, in part, connecting a first terminal of a first bistable regenerative circuit to a first current carrying terminal of a first transistor, connecting a second terminal of the first bistable regenerative circuit to a first current carrying terminal of a second transistor. The method further includes, in part, connecting a second current carrying terminal of the first transistor to a first signal line, connecting a second current carrying terminal of the second transistor to a second signal line, connecting a first current carrying terminal of a first non-volatile memory cell to the first signal line and connecting a first current carrying terminal of a second nonvolatile memory cell to the second signal line. The method further includes, in part, connecting control terminals of the first and second non-volatile memory cells to a third signal line, connecting gate terminals of the first and second transistors to a fourth signal line and connecting a second current carrying terminal of the first and second non-volatile memory cells to a fifth signal line. The method further includes, in part, connecting a third terminal of the first bistable regenerative circuit to a sixth signal line and connecting a fourth terminal of the first bistable regenerative circuit to a seventh signal line.

In some embodiment, the method further includes, in part, connecting a first terminal of a second bistable regenerative circuit to the first signal line and to a first current carrying terminal of a third transistor and connecting a second terminal of the second bistable regenerative circuit to the second signal line and a first current carrying terminal of a fourth transistor. The method further includes, in part, connecting a third terminal of the second bistable regenerative circuit to an eighth signal line and connecting a fourth terminal of the second bistable regenerative circuit to a ninth signal line. The method further includes, in part, connecting a second current carrying terminal of a third transistor to a tenth signal line, connecting a second current carrying terminal of a fourth transistor to an eleventh signal line and connecting gate terminals of the third and fourth transistors to the eighth signal line.

In some embodiment, the method further includes, in part, connecting an input terminal of a delay circuit to a twelfth signal line, connecting an output terminal of the delay circuit to the eighth signal line and connecting an inverted output terminal of the delay circuit to the ninth signal line. The method further includes, in part, connecting a first input terminal of a sense amplifier to the first signal line, connecting a second input terminal of the sense amplifier to the second signal line and connecting a first output terminal of the sense amplifier to the tenth signal line. The method further includes, in part, connecting a second output terminal of the sense amplifier to the eleventh signal line and connecting an third input terminal of the sense amplifier to the twelfth signal line.

In some embodiment, the method further includes, in part, providing a first data stored in the first terminal of the first bistable regenerative circuit, providing a logic complement of the first data stored in the second terminal of the first bistable regenerative circuit. The first data and the logic complement of the first data are a complementary or differential data bit. The method further includes, in part, regenerating the complementary or differential data bit in the second bistable regenerative circuit, storing the first data in the first non-volatile memory cell and storing a logic complement of the first data in the second non-volatile memory cell. Thus, the complementary or differential data bit provided in the first bistable regenerative circuit is stored in the first and second non-volatile memory cells.

In some embodiment, the method further includes, in part, providing a first data stored in the first terminal of the first bistable regenerative circuit and providing a logic complement of the first data stored in the second terminal of the first bistable regenerative circuit. The first data and the logic complement of the first data are a complementary or differential data bit. The method further includes, in part, sensing the complementary or differential data bit from the first bistable regenerative circuit, regenerating the complementary or differential data bit in the second bistable regenerative circuit, storing the first data in the first non-volatile memory cell and storing a logic complement of the first data in the second non-volatile memory cell. Thus, the complementary or differential data bit provided in the first bistable regenerative circuit is stored in the first and second non-volatile memory cells.

In some embodiment, the method further includes, in part, providing a first data stored in the first non-volatile memory cell and providing a logic complement of the first data stored in the second non-volatile memory cell. The first data and the logic complement of the first data are a complementary or differential data bit. The method further includes, in part, sensing the complementary or differential data bit from the first and second non-volatile memory cells, regenerating the complementary or differential data bit in the second bistable regenerative circuit, storing the first data in the first terminal of the bistable regenerative circuit and storing the logic complement of the first data in the second terminal of the first bistable regenerative circuit. Thus, the complementary or differential data bit provided in the first and second non-volatile memory cells is stored in the first bistable regenerative circuit.

DETAILED DESCRIPTION OF THE INVENTION

Figure 1A:
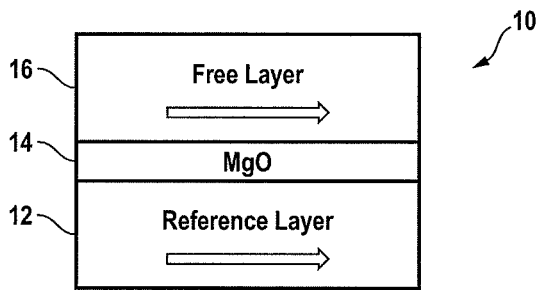
FIG. 1A is a simplified cross-sectional view of a magnetic tunnel junction structure of a magnetic random access memory cell when placed in a parallel magnetization state, as known in the prior art.
Figure 1B:
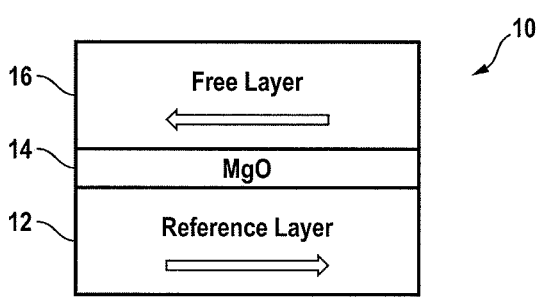
FIG. 1B shows the magnetic tunnel junction structure of FIG. 1A when placed in an anti-parallel magnetization state, as known in the prior art.
Figure 1C:
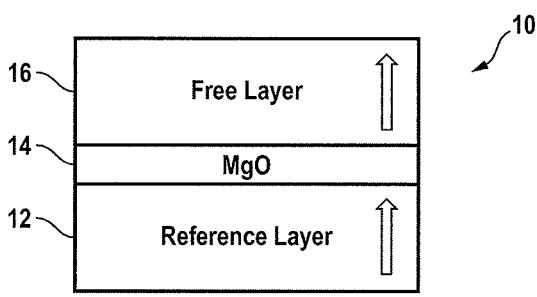
FIG. 1C is a simplified cross-sectional view of a magnetic tunnel junction structure of a magnetic random access memory cell when placed in a parallel magnetization state, as known in the prior art.
Figure 1D:
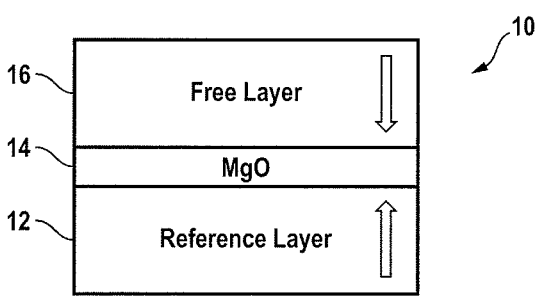
FIG. 1D shows the magnetic tunnel junction structure of FIG. 1D when placed in an anti-parallel magnetization state, as known in the prior art.
Figure 2A:
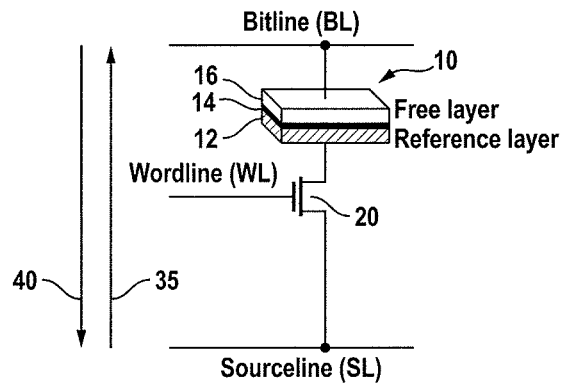
FIG. 2A shows a number of layers of a magnetic tunnel junction structure coupled to an associated select transistor, as known in the prior art.
Figure 2B:
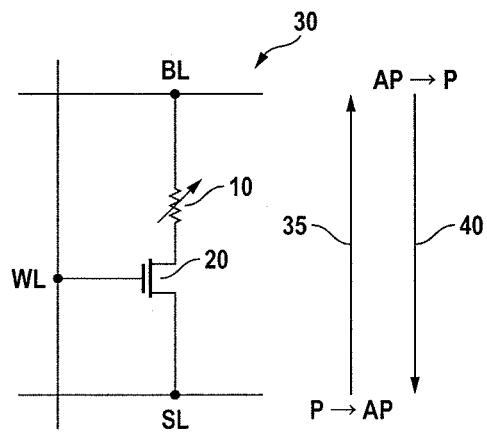
FIG. 2B is a schematic representation of the magnetic tunnel junction structure and its associated select transistor of FIG. 2A, as known in the prior art.
Figure 3:
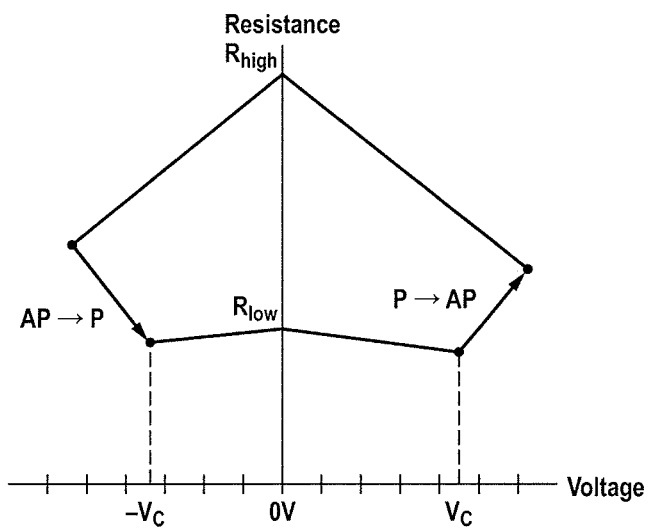
FIG. 3 shows the variation in the resistance of the magnetic tunnel junction structure of FIG. 2A in response to applied voltages, as known in the prior art.
Figure 4A:
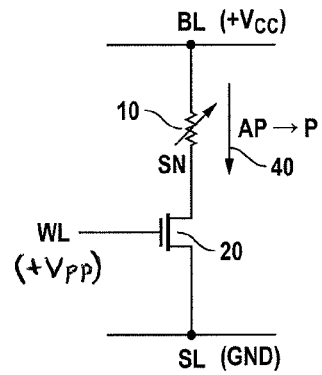
FIG. 4A shows a magnetic tunnel junction structure being programmed to switch from an anti-parallel state to a parallel state, as known in the prior art.
Figure 4B:
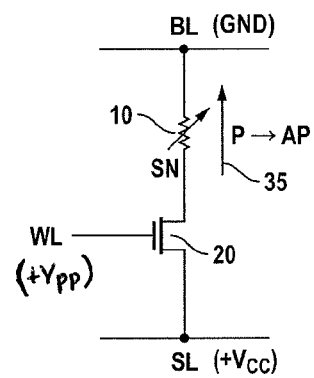
FIG. 4B shows a magnetic tunnel junction structure being programmed to switch from a parallel state to an anti-parallel state, as known in the prior art.
Figure 5:
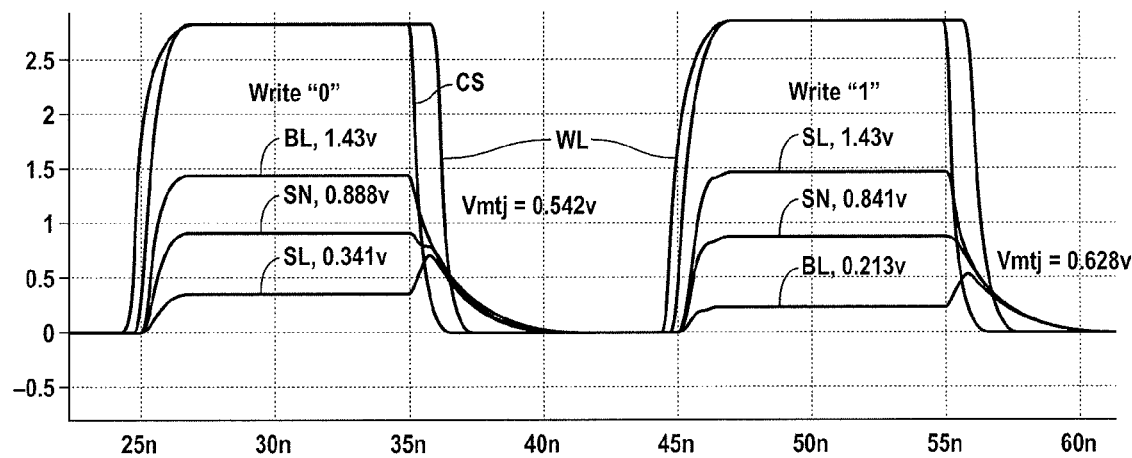
FIG. 5 is an exemplary timing diagram of a number of signals associated with a magnetic random access memory during write "0" and write "1" operations, as known in the prior art.
Figure 6A:
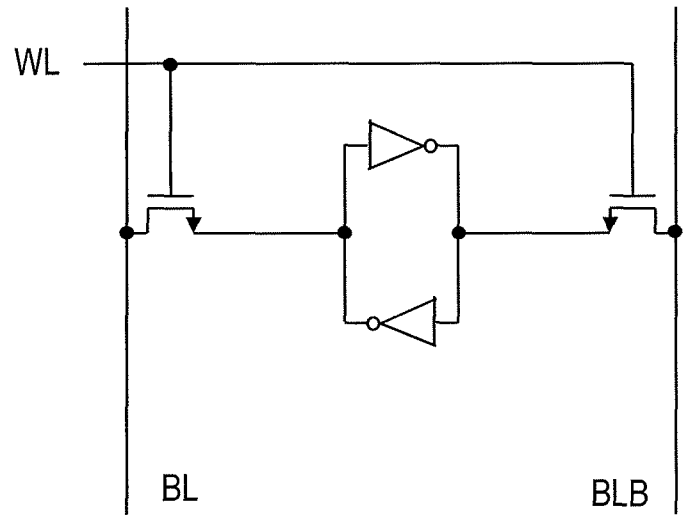
FIG. 6A is a schematic diagram of a SRAM cell, as known in the prior art.
Figure 6B:
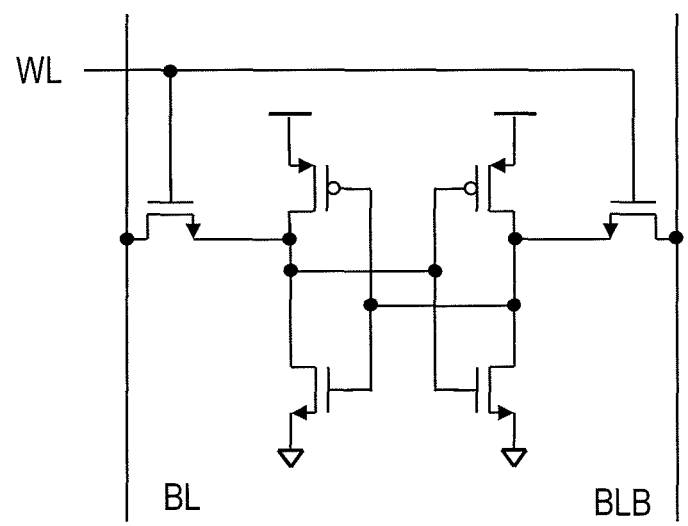
FIG. 6B is a schematic diagram of a SRAM cell implemented in CMOS logic, as known in the prior art.

In accordance with embodiments of the present invention, data stored in a volatile SRAM memory may also be stored in separate non-volatile memory (NVM) circuits. During system power up, data from the NVM may be loaded into SRAM where system operations are executed faster. When power is shut down it may be desirable to transfer data currently in SRAM to NVM so the latest data can be available again after power is restored. When the NVM and SRAM are implemented on separate chips in a system, the speed of data transfer is limited by the relatively long time and high power taken to drive large capacitive and or inductive interconnect circuit loads between the chips. In addition, the data transfer speed is limited by the narrow data bus width between chips. These limitations can be reduced by integrating the SRAM and NVM on the same SOC. But separate memory circuits may still require separate dedicated ancillary circuits such as decoders, sense amplifiers and control circuits which can still introduce speed, power, and area penalties. Integrating SRAM and NVM such as floating gate based Flash or EEPROM on the same SOC may be costly due to process complexity. In contrast, STT-MRAM may be easier and cheaper to integrate with SRAM into a SOC process. Integrating the SRAM and STT-MRAM combined within the same memory further reduces the limitations discussed above and may provide a more cost effective solution.

In accordance with an embodiment of the present invention, a volatile memory storage portion of the non-volatile SRAM cell includes a bistable regenerative circuit element which may be in the form of an Eccles-Jordan, a bistable multivibrator, a latch or a flip-flop circuit and will be commonly called a latch hereinafter. The latch portion of the non-volatile SRAM cell may have two input/output signals which store complementary or differential data meaning when the first input/output signal is a high level, the second input/output signal will be at the first signal's complement or a low level. The NVM portion of the cell includes a pair of NVM cells capable of storing the same or different complementary or differential data as stored in the volatile memory portion of the cell. The NVM cells may be manufactured of any kind of NVM technology that is electrically erasable and reprogrammable including but not limited to embodiments using EEPROM, FLASH, FeRAM, PRAM, MRAM or STT-MRAM cells. Each NVM cell may have at least three terminals, two for carrying current and a third control terminal that can shut off or allow current flow through the NVM cell depending on the voltage or current applied to the third terminal. In one embodiment each of the pair of STT-MRAM cells are directly electrically connected within the same cell circuit to the latch. The volatile memory and NVM portions of the cell can be independently operated by separate select controls provided for each portion in a row or word line (WL) direction of a memory. A complementary or differential data bit stored on the volatile or NVM portion of the cell can be quickly and directly transferred to the NVM or volatile portion of the cell respectively, without having to process the data by an ancillary sensing circuit outside the memory cell. Complementary data may thus be transferred quickly from the volatile memory to NVM in order to save the data before it becomes lost when power is shut down or corrupted by a power glitch. Conversely, a complementary data bit stored on the pair of NVM cells can be written directly to the volatile memory portion of the same cell providing fast system boot up when power is restored and the ability for the system to later execute from the faster volatile or SRAM memory for normal operation. Applications are not limited to, but include embedded or distributed field programmable gate arrays (FPGA) and shadow RAM for SOC. Embodiments of the non-volatile SRAM cell may also be used as a register logic element or a multitude of such cells may be used in a memory array organized in rows and columns.

Figure 7:
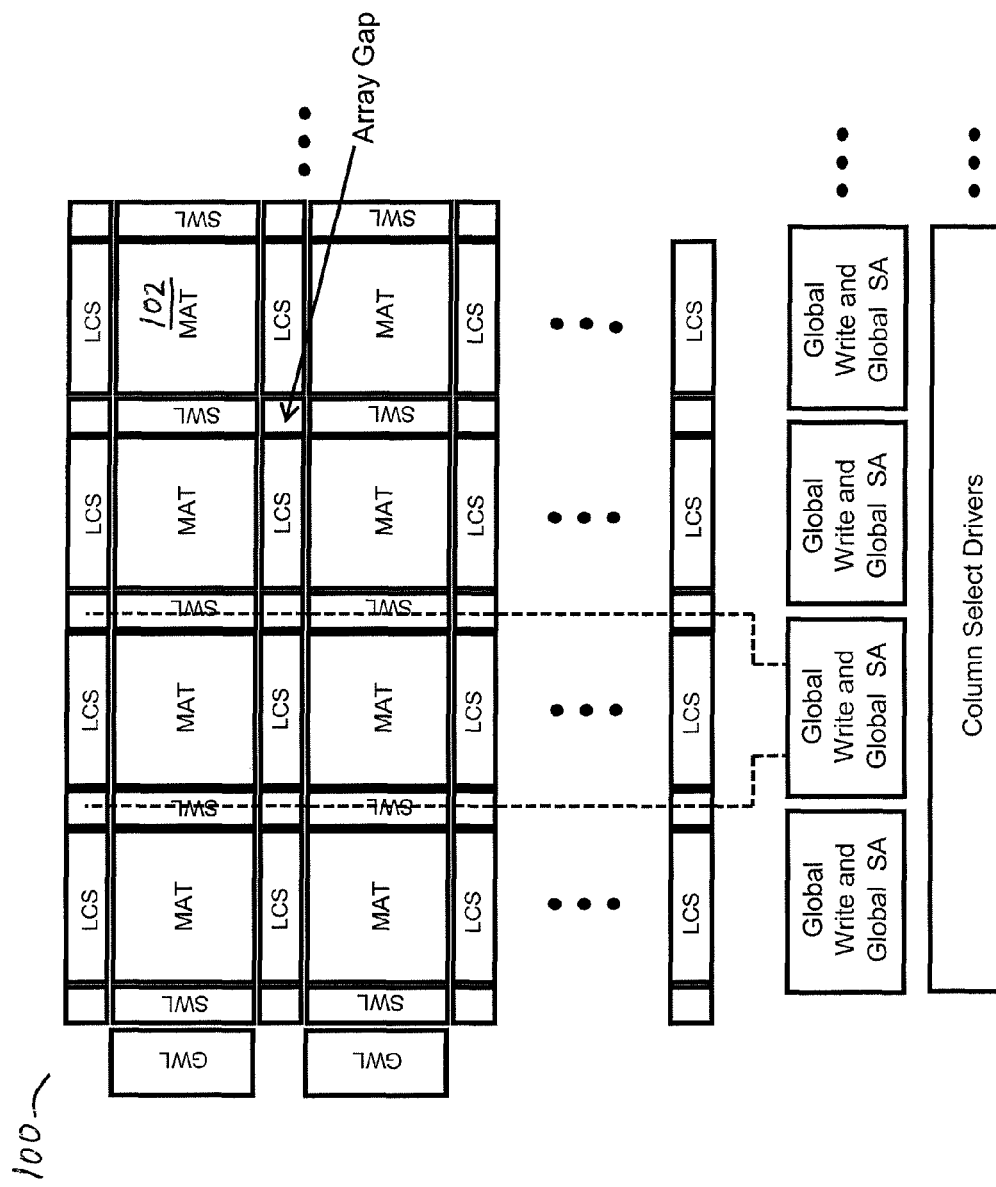
FIG. 7 is a schematic diagram of portions of a non-volatile SRAM memory array and associated writing and reading circuitry, in accordance with one embodiment of the present invention.

Embodiments of the non-volatile SRAM cell may be replicated to form a multitude of such cells in a memory array organized in rows and columns. The following description in reference to FIG. 7 is reproduced from application Ser. No. 61/352,306, filed Jun. 7, 2010, which is incorporated herein by reference in its entirety. FIG. 7 is a block diagram of a MRAM array and associated writing and reading circuitry 100, hereinafter alternatively referred to as MRAM 100, in accordance with one embodiment of the present invention. MRAM 100 includes a multitude of array blocks selected by a column select driver, a multitude of global write, a multitude of global sense amp (SA), a multitude of global word line (GWL) circuits, and a control circuit (not shown). Each block may include an array of MRAM cells (memory array tile, or MAT) 102 whose rows are selected by one or more sub word line (SWL) circuits and whose columns are selected by one or more local column select circuits (LCS).

Figure 8:
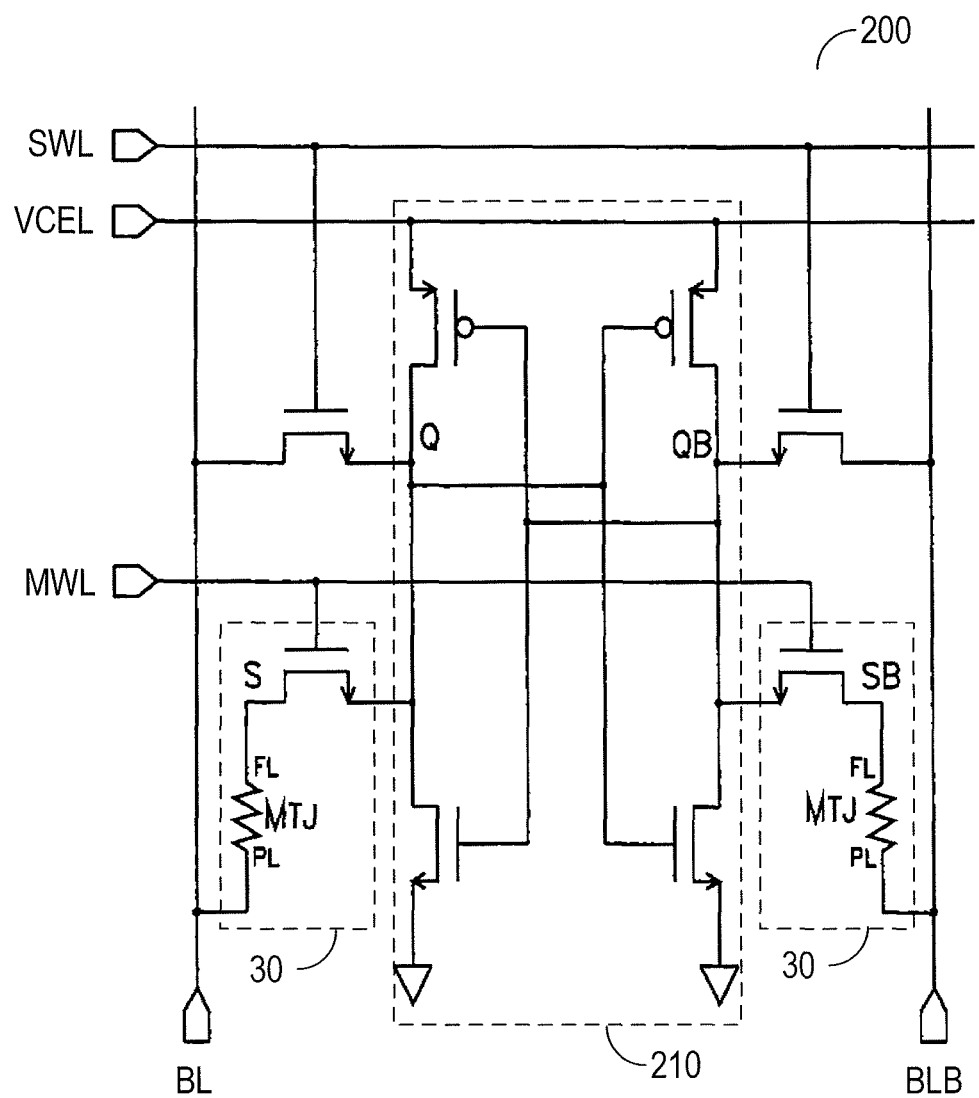
FIG. 8 is a schematic diagram of a non-volatile SRAM memory cell circuit, in accordance with one exemplary embodiment of the present invention.

The following description is provided with reference to embodiments of a non-volatile SRAM cell that can transfer complementary data between volatile and NVM portions within the same cell. FIG. 8 is a schematic diagram of a non-volatile SRAM memory cell circuit 200 with the NVM storage portion of the cell directly electrically connected to the volatile storage portion within the same cell, in accordance with one embodiment of the present invention. The volatile storage portion of the memory cell includes a bistable regenerative circuit element 210 as shown within the dotted line rectangle. The bistable regenerative circuit element may be a latch including two cross coupled inverters which may be CMOS inverters as shown. Each inverter has an input and an output. The output of one inverter is connected to the input of the other inverter. The latch includes a pair of complementary input/output signals (Q and QB) which may be coupled through one of a pair of latch select transistors which are controlled by a SRAM word-line (SWL) signal, to a pair of complementary bit-line signals (BL and BLB) respectively. Power is supplied to the latch by a voltage cell line (VCEL) which can be adjusted in level to optimize programming of the STT-MRAM cells, which will be explained below, or may be adjusted to conserve power to the latch during standby, or to provide faster latch read operation. The volatile storage portion of the cell including latch, latch select transistors, SWL and complementary bit-lines may be recognized as a common 6T CMOS SRAM cell whose operation will not be explained in detail since it is understood by persons of ordinary skill in the art.

Still referencing FIG. 8, the NVM portion of cell 100 includes two NVM cells 30 also shown in the dotted line rectangles. One of one of the pair of NVM cells, marked S within its dotted line box, may be directly electrically connected within the same cell circuit between the Q and BL signals within the same cell circuit. The other one of the pair of NVM cells, marked SB within its dotted line box, may be directly electrically connected within the same cell circuit between the QB and BLB signals within the same cell circuit. In one embodiment, the MVM cells may be STT-MRAM cells. Each one of the pair of STT-MRAM cells include a MTJ element connected in series with a MRAM select transistor. Both MRAM select transistors are controlled by a MRAM word-line (MWL) signal. In one embodiment as shown in FIG. 8, the MRAM select transistors are directly electrically connected to the Q and QB signals respectively, and the MTJs are directly electrically connected to the BL and BLB signals respectively. The MTJ connected to BL will be called MTJS and the MTJ connected to BLB will be called MTJSB. In this embodiment, MTJS and MTJSB are both connected with their free layer (FL) directly connected to the MRAM select transistors. It should be understood by one of skill in the art that the series connection of the MTJ and MRAM select transistor can be swapped without limiting the invention. In other words, the FL terminal of the MTJs may be electrically connected to the latch and the MRAM select transistor may be electrically connected to the BL/BLB signals. However, the orientation of the FL and PL terminals of the MTJ will be dependent on the embodiment as discussed below.

Figure 9:
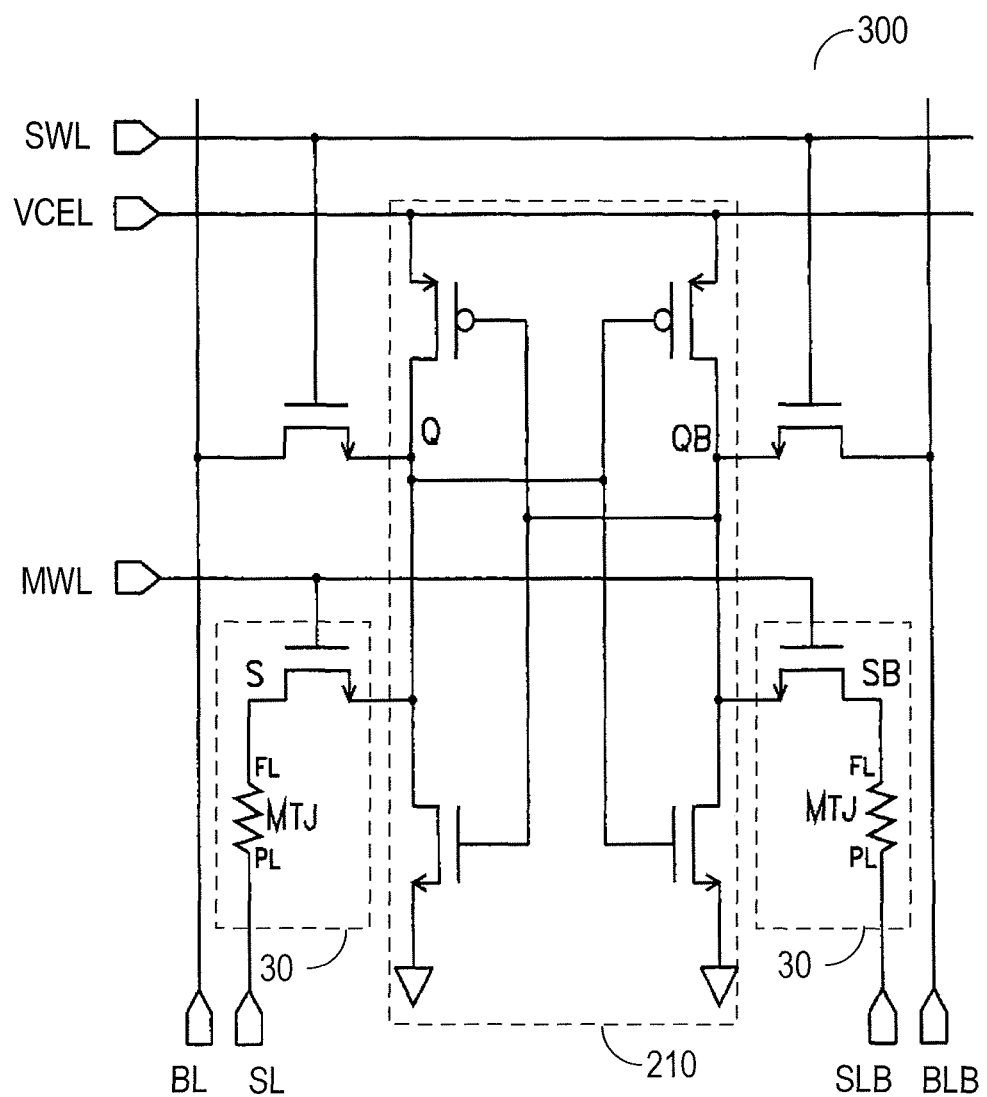
FIG. 9 is a schematic diagram of a non-volatile SRAM memory cell circuit with dual complementary column data signals, in accordance with one exemplary embodiment of the present invention.

FIG. 9 is a schematic diagram of a non-volatile SRAM memory cell circuit 300, in accordance with one exemplary embodiment of the present invention. In this embodiment, the cell 300 has dual complementary signal paths in the column (or bit line) direction of the memory. The NVM portion of the cell has a separate complementary column signal SL/SLB which is different from the latch's complementary column signal BL/BLB. FIG. 9 shows the same elements as FIG. 8 except that one end of each of the pair of NVM cells is directly electrically connected within the same cell circuit to a respective SL and SLB signal instead of to the respective BL and BLB signals. In one embodiment as shown, the MTJs are directly electrically connected to the SL and SLB signals respectively. The MTJ connected to SL will be called MTJS and the MTJ connected to SLB will be called MTJSB. Thus, separate complementary column data sensing paths and or different complementary write voltage values can be applied to the cell 300 to optimize read and or write operation separately for the volatile and for the NVM portions of the cell.

Figure 10:
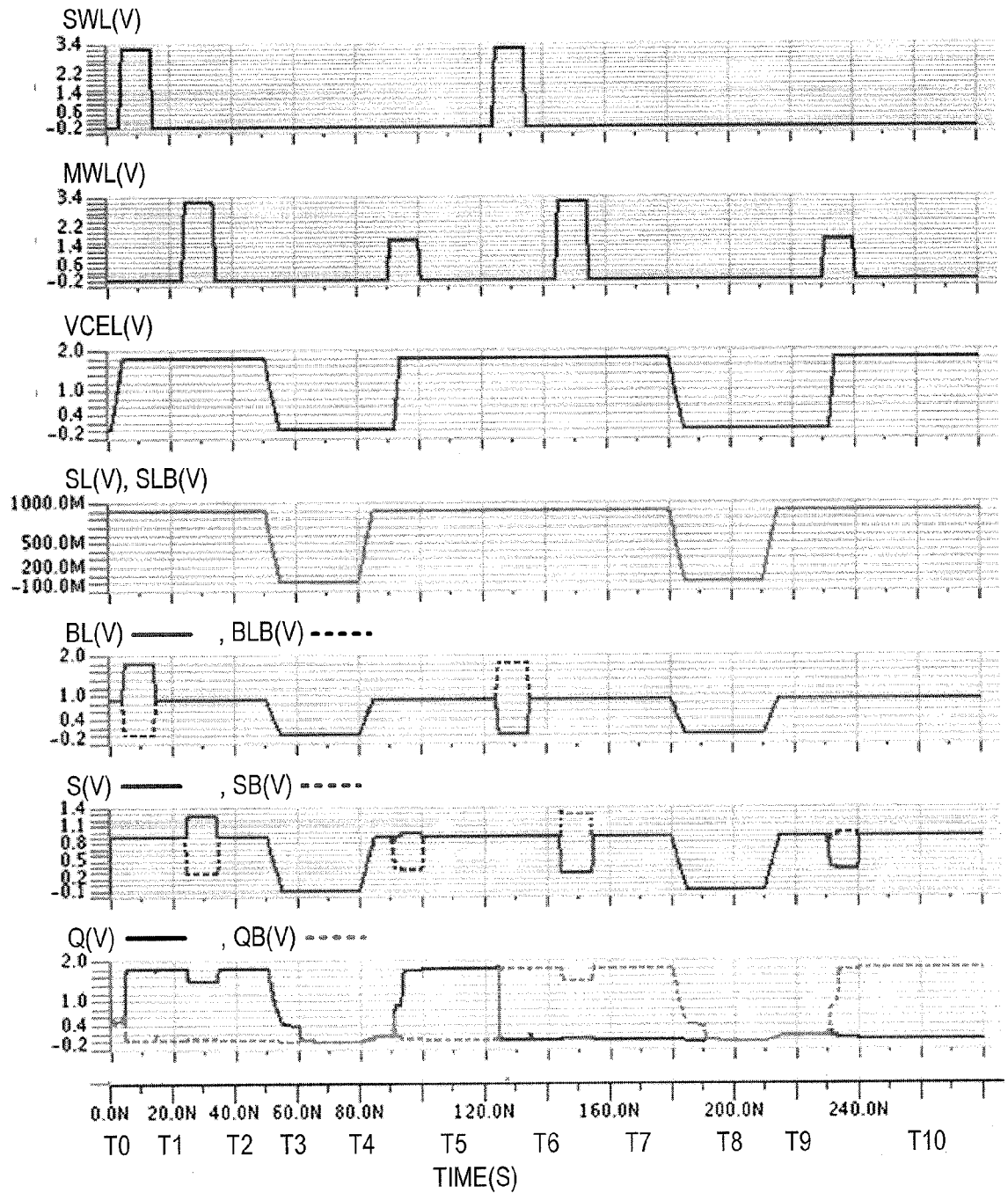
FIG. 10 is a timing diagram of a number of signals used during write and restore operations of the non-volatile SRAM memory cell of FIG. 9, in accordance with one exemplary embodiment of the present invention.

FIG. 10 is a timing diagram of the simulated voltage signals at nodes SWL, MWL, VCEL, SL, SLB, BL, BLB, S, SB, Q and QB associated with the cell 300 circuitry of FIG. 10 during data write and data restore operation methods in accordance with one exemplary embodiment of the present invention. In one embodiment and for consistency in this application, the definition for storing a data bit=1 may be defined by storing a logic high on Q and a logic low on QB. In this embodiment that corresponds to MTJS being programmed in a low resistance (P) state and MTJSB being programmed in a high resistance (AP) state as will be described below. The MTJ orientation may depend on the embodiment as described for each embodiment discussed below. Data bit=0 may be stored when the data stored on Q is a logic low and QB is logic high or when MTJS is in a high resistance (AP) state and MTJSB is in a low resistance (P) state. It is understood that in other embodiments, a data=1 storage condition may be defined by storing a low logic level on Q and corresponding reverse logic states for the other storage elements in the cell. From T0-T5, the sequence of events shown in FIG. 10 represents writing data=1 to the latch from outside the memory cell, transferring the data directly from the latch to the STT-MRAM portion of the same cell, powering down the memory cell thus loosing the data from the latch, and restoring the previously stored data=1 from the STT-MRAM portion directly to the latch portion of the same cell. From T5-T10, the same sequence is then repeated except for writing data=0.

At T0, SWL, MWL and VCEL are about 0V or GND, and SL, SLB, BL, BLB have been previously precharged to about VCELP/2 or about 0.8V. VCELP is about twice the voltage needed for writing to the MTJ elements. VCELP may be the same as or different than a VDD used to drive other logic on chip and may be in a range between about twice the MTJ programming voltage to about VPP. Since both select signals SWL and MWL are disabled, no current flows through MTJS nor through MTJSB so S and SB follow SL and SLB respectively. Q and QB are initially set to 0.5V for simulation purposes to better show the subsequent circuit behavior but in real operation would probably be near GND following a VCEL=GND condition. In the embodiment shown in FIG. 10, a signal is asserted when receiving a high logic level corresponding to the voltage VCC, VDD, VPP, or in-between and deasserted when receiving a low logic level corresponding to the ground potential or below ground potential, as is well known. It is understood that in other embodiments, a signal may be asserted when receiving a low logic level, and deasserted when receiving a high logic level.

A data bit=1 is written to the latch portion of cell 300 from time T0-T1. VCEL may be brought up to VCELP or about 1.8V in one embodiment. Then the BL is driven to VCELP while BLB is driven to about GND, consistent with writing a complementary data=1 bit. SWL may be pulsed to a voltage between that which is sufficient to turn on the latch select transistors, such as VDD, but equal to or below VPP so that signal coupling from SWL does not apply excess stress voltage to the MTJ elements. FIG. 10 shows SWL is pulsed to VPP or about 3.2V to enable the latch select transistors turn on and transfer the complementary voltage data from BL and BLB to Q/QB respectively on the rising edge of SWL. The bistable regenerative element latches the data=0 condition on the falling edge of SWL so Q and QB remain VCELP and GND respectively even after BL and BLB are brought back to about one half VCELP.

Continuing to refer to FIG. 10, from T1 to T2 the data may be written from the latch to the NVM portion of the cell by pulsing MWL to a level between VDD and VPP (shown) which enables the MRAM select transistors and transfers the voltage stored on Q and QB to one end of MTJS and MTJSB respectively. The MWL level may be chosen to enable efficient transfer without disturbing the data stored on the latch nor overstress the MTJ elements. The other ends of both MTJ elements are connected to SL and SLB which are still held at about VCELP/2. Since Q and QB are either GND or VCELP, depending on the data stored on the latch, and since the SL and SLB lines are both at VCELP/2, one MTJ element will see a potential of VCELP/2 and current will flow into the cell through that MTJ, while the other MTJ element will see a negative VCELP/2 potential applied across its terminals and current will flow through that MTJ out of the cell. Since VCELP/2 is an sufficient potential to write to the MTJ elements, the MTJ elements will program according to the data stored on Q and QB. In other words, MTJS has a potential=Q−SL=Q−VCELP/2 applied across its terminals, while MTJSB has a potential=QB−SLB=QB−VCELP/2 applied across its terminals. Since data=1 was previously stored in the latch, Q=VCELP and QB=GND. Thus MTJS and MTJSB have VCELP/2 and negative VCELP/2 applied across their terminals respectively. In this embodiment, MTJS will program to a P or low resistance state and MTJSB will program to an AP or high resistance state unless they are already so programmed. That is arranged by connecting the free layer (FL) end on each MTJ element to its respective MRAM select transistor. The reason for this arrangement, which is different than in the prior filed applications which have been incorporated by reference, will become clear during the description when data is restored from the NVM portion back to the latch. Thus, MTJS will have programming current flowing into its FL end through the MTJ and out its PL end. In complementary fashion, MTJS will have programming current flowing into its PL end through the MTJ and out its FL end. The data was transferred directly from the latch to the NVM portion of the cell 300 simply by pulsing the MWL signal without having to sense the data on the latch by any sense amplifier circuitry. Thus, the complementary data bit is written to the NVM portion of cell 300.

From T2 to T4, a power shut off is simulated by bringing all the voltages to GND so that the latch portion of the cell, which is volatile memory, loses the data stored therein. Since the MTJ elements are nonvolatile, their programming state and thus the complementary data stored therein is preserved even during the power outage or power glitch. During T4 the simulation caused the voltage on Q and QB to be set to GND to ensure data was completely lost from the latch. At T4 power is ramped up and SL, SLB, BL and BLB ramp up again to about VCELP/2 while SWL, MWL, and VCEL are still held at GND. Q and QB which were previously forced to GND are no longer forced but initially remain at GND.

Still referring to FIG. 10, from T4-T5 data from the NVM portion of cell 300 will be directly restored to the latch without having to be sensed by any sense amplifier circuit outside the non-volatile SRAM cell. After the SL, SLB, BL and BLB lines stabilize at about VCELP/2, MWL is pulsed to a voltage between that which is sufficient to turn on the MRAM select transistors such as VDD but below VPP so that signal coupling from MWL does not overly disturb the Q and QB nodes which are both initially near or at GND nor apply excess stress voltage to the MTJ elements. In the embodiment shown the MWL line is pulsed to about VDD or about 1.8V. At the leading edge of MWL current begins to flow from SL and SLB and through the MTJ elements. Both Q and QB will start to charge at different rates since one MTJ element has previously been programmed to a P or low resistance state and the other MTJ element to an AP or high resistance state in complementary fashion. One side of the latch which is connected to the MTJ which is in the low resistance state will charge faster than the other side which has the complementary high resistance state creating a small complementary signal on the latch inputs. Soon after, VCEL is ramped to VCELP which causes the latch to regenerate the small complementary signal and fully restore the data in the latch that was previously stored on the NVM portion of the cell. In a CMOS circuit embodiment (as shown) the small complementary or differential signal is restored to about VCELP and about GND by the regeneration behavior of the CMOS latch. In the description of the embodiment above, MTJS was programmed to a P or low resistance state and MTJSB was programmed to an AP or high resistance state. That was arranged by connecting the free layer (FL) end on each MTJ element to its respective MRAM select transistor. The purpose of this was to ensure that Q would charge faster than QB so that Q would have a slightly higher voltage than QB when VCEL is ramped to VCELP, so that the data would be regenerated or flipped consistently with restoring a data=1 value in the latch. The simulation shows the restore operation was accomplished successfully since the value of Q is logic high and QB is logic low after the leading edge of MWL which matches the value of Q and QB stored before Q and QB were forced to GND during the power down. Between time T5-T10 the entire sequence described above for T0-T5 is repeated except a complementary data=0 is written to the latch and restored. Thus, the previously saved data is restored quickly and directly from the NVM portion of the cell back to the latch portion of the same cell by a single pulse and without having to be sensed by a sense amplifier outside the cell.

In other embodiments the data=1 corresponding to Q storing a logic high voltage may be changed to Q storing a logic low by reversing the FL and PL orientations of the MTJ elements. It would also be obvious to one skilled in the art that the MTJ elements could be directly connected to their respective Q and QB nodes and the MRAM select transistors connected between the MTJ elements and their respective SL and SLB lines without significantly changing the operation of the cell 300.

In one embodiment, the intermediate levels of SL and SLB may be set to a different intermediate level than BL and BLB so as to optimize the operation of the cell. In this embodiment BL and BLB may be switched between VCELP and GND instead of an intermediate VCELP/2 in similar fashion to SRAMs known in the art and using a standard driver instead of a three level driver. In another embodiment SL and SLB are tied together and are one and the same signal.

The timing diagram shown in FIG. 10 may also be used in similar fashion to represent the simulated voltage signals at nodes SWL, MWL, VCEL, BL, BLB, S, SB, Q and QB associated with the cell 200 circuitry shown in FIG. 8 during data write and data restore operation methods in accordance with one exemplary embodiment of the present invention. In this embodiment the SL and BL lines are tied together and the SLB and BLB lines are tied together. In this embodiment a three level driver is used to drive BL and BLB and these signals are returned to about VCELP/2 between applying write pulses to the latch. When complementary data is written to the latch during the BL and BLB pulse and MWL is disabled, the S and SB signals will follow the BL and BLB.

The rest of the operation of the cell 200 will be similar as has been described above with reference to the cell 300.

Figure 11:
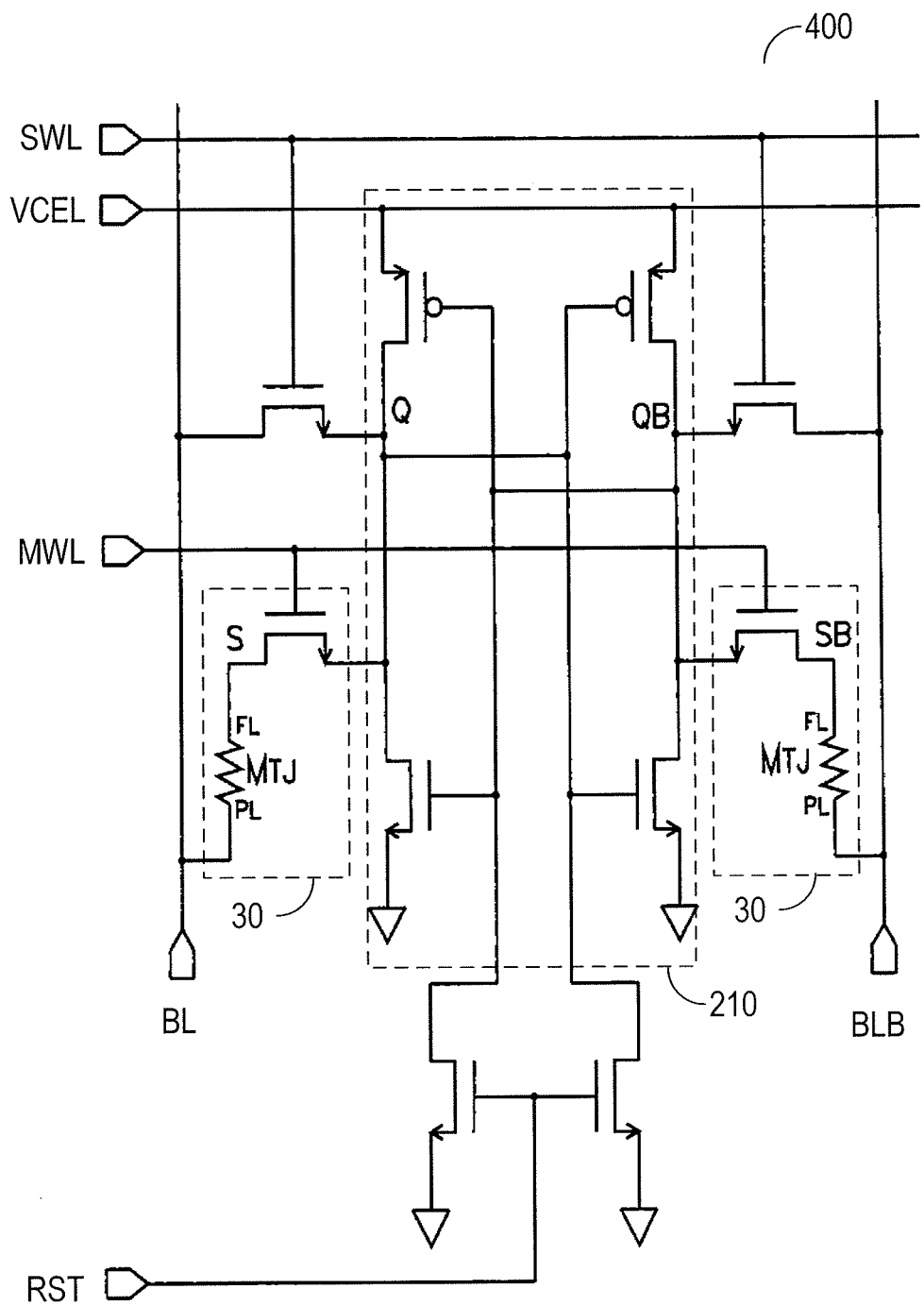
FIG. 11 is a schematic diagram of a non-volatile SRAM memory cell circuit with reset signals, in accordance with one exemplary embodiment of the present invention.

FIG. 11 is a schematic diagram of a non-volatile SRAM memory cell circuit 400, in accordance with one exemplary embodiment of the present invention. FIG. 11 shows the same elements as FIG. 8 with the addition of a pair of pull down transistors which are controlled by a reset signal (RST) and which are coupled between Q/QB and GND. When RST is enabled high, both the Q and QB signals are discharged to ground. I another embodiment (not shown), a reset power supply line may be used instead of GND and the Q and QB signals are discharged to the reset power supply level instead of GND. Applying the reset eliminates any data stored in the volatile portion of the cell before writing data from the NVM portion to the latch portion. Higher complementary charging currents during restore operation, and thus higher operating speed, are obtained when the Q and QB nodes are near ground. The reset may also overcome problems with residual charge imbalances on Q and QB that the MRAM portion would have to overcome. The RST signal may be generated by control circuitry (not shown) and may be generated during chip power up and data restore cycles.

Figure 12:
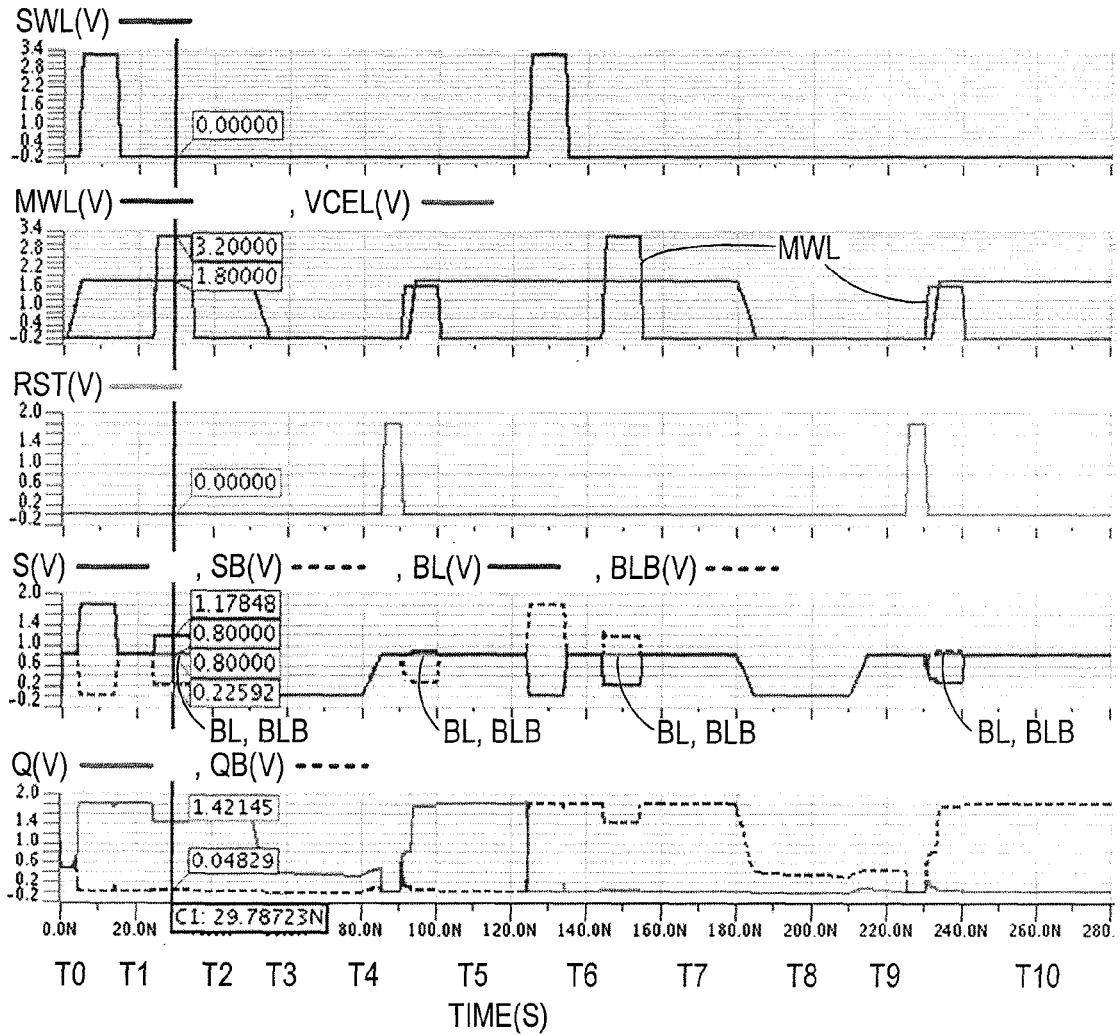
FIG. 12 is a timing diagram of a number of signals used during write and restore operations of the non-volatile SRAM memory cell of FIG. 11, in accordance with one exemplary embodiment of the present invention.

FIG. 12 is a timing diagram of the simulated voltage signals at nodes SWL, MWL, VCEL, BL, BLB, S, SB, Q and QB associated with the cell 400 circuitry shown in FIG. 11 during data write and data restore operation methods in accordance with one exemplary embodiment of the present invention. RST is pulsed before the MWL line is pulsed to drain any residual charge from Q and QB to GND. After RST is disabled, the MWL pulse is applied to restore a small signal of complementary data from the NVM portion to the latch portion of the cell followed by ramping the VCEL to VCELP to regenerate full logic levels to the complementary data.

The different embodiment including the features of the reset transistors, the tied together SL/BL and SLB/BLB lines and the separate SL/BL and SLB/BLB lines may be combined in different combinations as determined by design needs as would be understood by persons of skill in the art using the descriptions herein.

In one embodiment, multiple non-volatile SRAM cells each capable of storing at least one complementary data bit may be coupled to a complementary data column. The cells may be arranged in rows within the column. In another embodiment the column is replicated to form an array of non-volatile SRAM memory cells arranged in rows and columns. In another embodiment it may be desirable to have separate physical sections of the complementary data column contain the volatile memory portions of the cells while a different physical section of the same column contain the NVM portions, the separated volatile and non-volatile cell portions still corresponding to each other electrically and by circuit topology even though they may be physically separated. In other words, each volatile portion of a cell would have a corresponding NVM portion of the cell on the same column. Separating latch and NVM cell portions into separate spatially relocatable portions and grouping those portions into separate NVM and latch sections on the same column may provide chip layout area savings or simpler circuit arrangement for decoding the memory.

Figure 13:
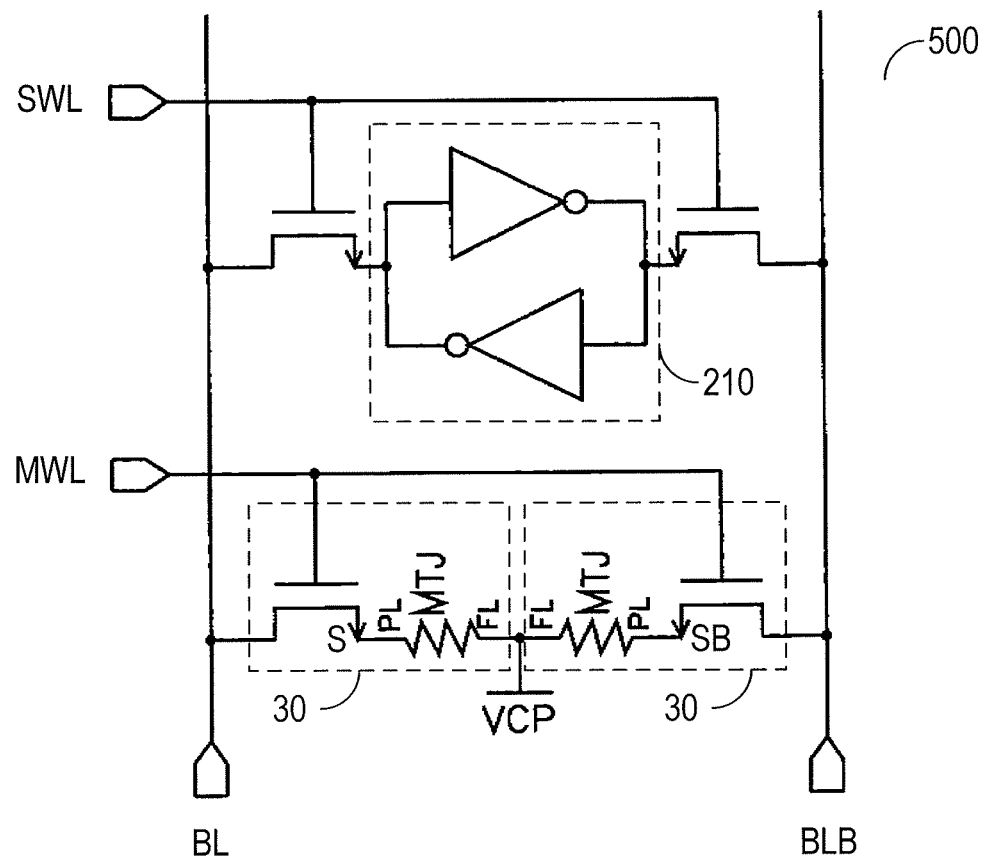
FIG. 13 is a schematic diagram of a non-volatile SRAM memory cell circuit with spatially relocatable memory portions, in accordance with one exemplary embodiment of the present invention.

FIG. 13 is a schematic diagram of a non-volatile SRAM memory cell circuit 500 with spatially relocatable memory portions, in accordance with one exemplary embodiment of the present invention. FIG. 13 shows the same volatile portion of the cell as FIG. 8, or more specifically the 6T SRAM cell, but the NVM portion of the cell 500 is connected differently. One of the pair of NVM cells, marked S within its dotted line box, may be directly electrically connected within the same cell circuit between a VCP signal and a BL signals within the same cell circuit. The other one of the pair of NVM cells, marked SB within its dotted line box, may be directly electrically connected within the same cell circuit between VCP and BLB signals within the same cell circuit. In one embodiment the NVM cells may be STT-MRAM cells. In one embodiment, the MRAM select transistors are directly electrically connected to the BL and BLB signals respectively, and the pair of MTJ elements are directly electrically connected to the common VCP line as shown. The operation of the cell is similar to that described in reference to FIG. 9 except, one end of the MTJ elements are tied together and coupled to VCP which will be driven to about VCELP/2 in similar fashion as SL and SLB in FIG. 9, and the other differences described below.

Figure 14:
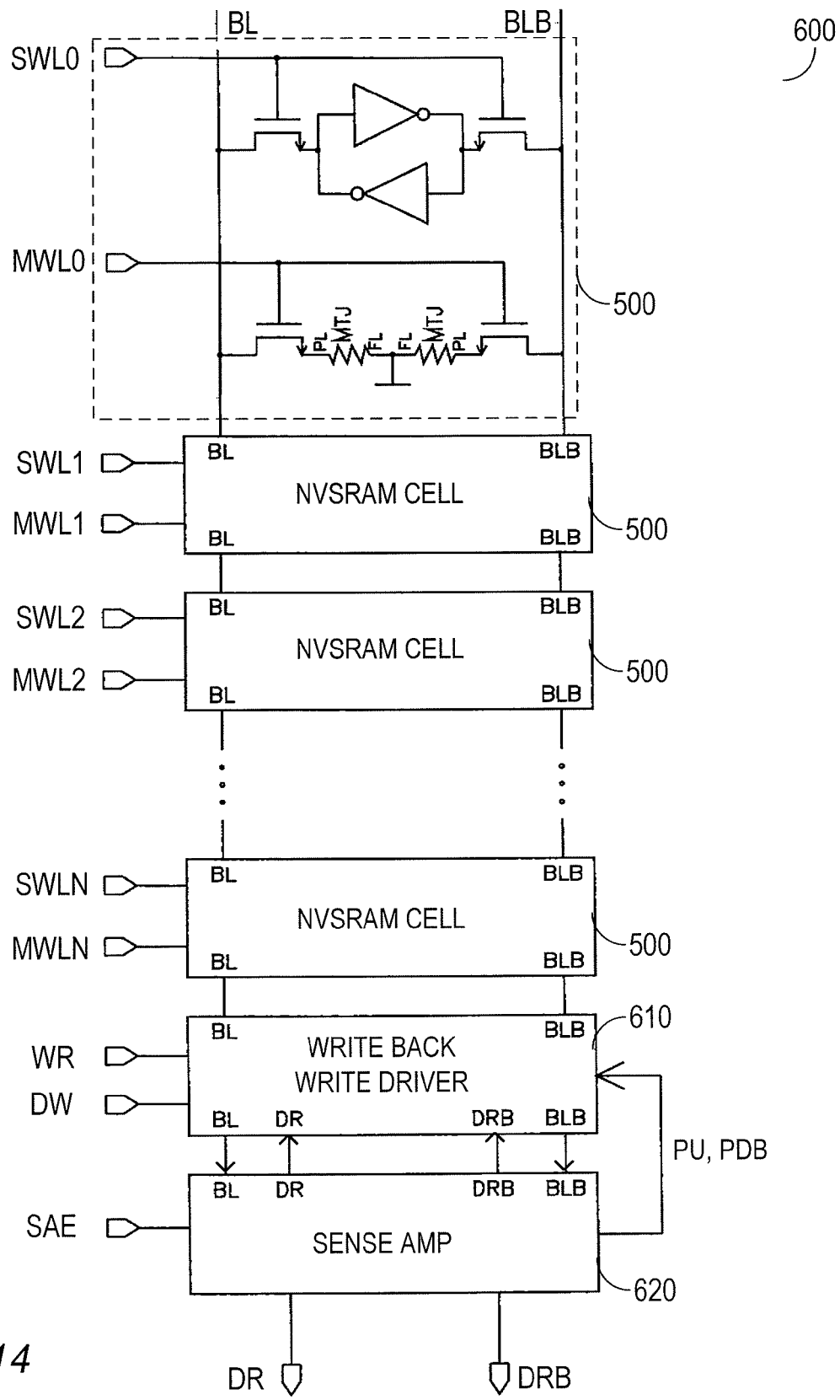
FIG. 14 is a schematic diagram of a column circuit, in accordance with one exemplary embodiment of the present invention.

FIG. 14 is a schematic diagram of a column circuit 600 including multiple non-volatile SRAM memory cells 500, in accordance with another exemplary embodiment of the present invention. In this embodiment, multiple non-volatile SRAM cells each capable of storing at least one complementary data bit may be coupled to a complementary data column, BL/BLB. An individual cell of the multiple non-volatile SRAM memory cells may be selected using the associated SWLN and MWLN signal lines corresponding to the desired cell and driven by a GWL decoder (shown in FIG. 7). N corresponds to the number of cells connected to the column. If BL and BLB have relatively high capacitive loading, the direct transfer of data between SRAM and NVM portions of the cell may be difficult due to the loading of the differential signals from the cell and an indirect data transfer may be used. In one embodiment, a differential sense amp 620 takes its input from BL and BLB to read data quickly from either the latch or the NVM portion of a selected cell. The sense amp is enabled by a sense amp enable signal (SAE) generated by control logic (not shown). Owing to the polarity of the sense amplifier response, the MTJ orientation has been reversed in cell 500 compared to the earlier embodiments so the FL end of the MTJs is tied to the VCP supply. Several embodiments of sense amplifiers have been described in application Ser. No. 12/558,451, filed Sep. 11, 2009, entitled "DIFFERENTIAL READ AND WRITE ARCHITECTURE," and incorporated herein by reference in its entirety. Other commonly known high speed differential SRAM sense amplifiers may also be used in addition to the amplifier used to sense the STT-MRAM cells. A write back write driver 610 is also coupled to BL and BLB to locally amplify the weak differential signals from the cell and boost their levels to logic levels capable of storing data either on the latch or the NVM portions of the cell using a write back circuit. The driver 610 takes inputs from DR, DRB, PU and PDB generated by the sense amp. The driver 610 will also include two write driver circuits controlled by WR and DW signals generated by control circuitry (not shown), one write driver driving BL and one driving BLB to enable programming of the NVM portion of the cell as described in application Ser. No. 12/544,189, filed Aug. 19, 2009, entitled "DYNAMIC MULTISTATE MEMORY WRITE DRIVER" or application Ser. No. 61/352,306, filed Jun. 7, 2010, entitled "MULTI-SUPPLY SYMMETRIC DRIVER CIRCUIT AND TIMING METHOD," the contents of both of which are incorporate herein by reference in their entirety. The signals WR and DW may correspond to signals ENWR and GWRL respectively in the aforementioned references.

Figure 15:
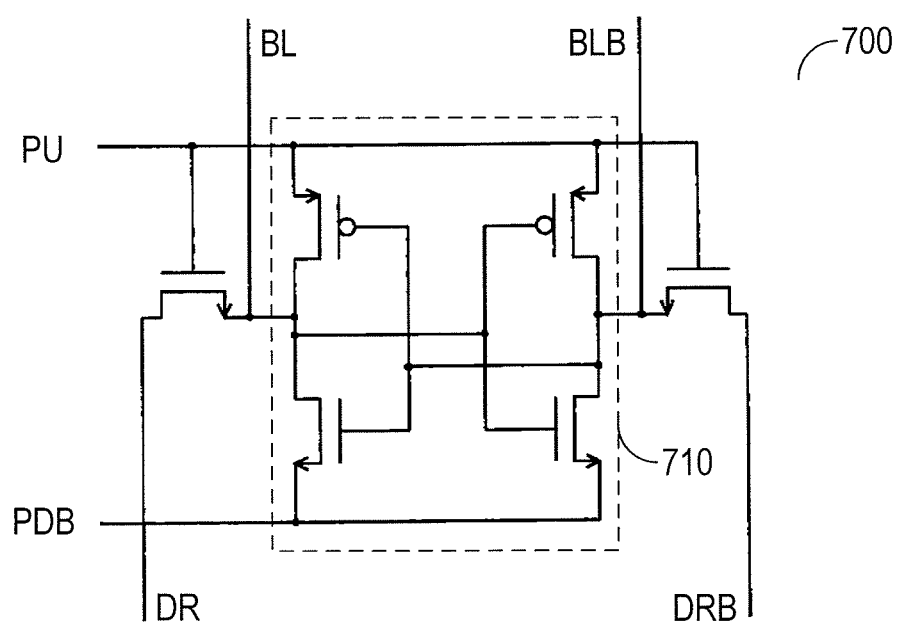
FIG. 15 is a schematic diagram of a write back circuit, in accordance with one exemplary embodiment of the present invention.

FIG. 15 is a schematic diagram of a write back circuit 700 located in a write back write driver, in accordance with one embodiment of the present invention. The write back circuit includes a latch 710 with higher drive capability than latch 210. The latch 710 drives BL and BLB to complementary levels supplied on PU and PDB. This action is similar to the regenerative amplification or boosting described earlier in reference to latch 210. The circuit 700 also includes a pair of transfer gates controlled by PU such that when PU is disabled (GND) the latch 710 is powered down and the DR and DRB outputs from the sense amp are isolated from the BL and BLB signals respectively. When PU is about VCELP or other high level that can store data on the latch 210 in the cell, the transfer gates are enabled and couple DR and DRB from the sense amp to the BL and BLB lines respectively, and the PDB line is pulled to GND, enabling the latch 710 to regenerate or boost the differential signal input from the sense amp to logic levels set by the levels on PU and PDB.

Figure 16:
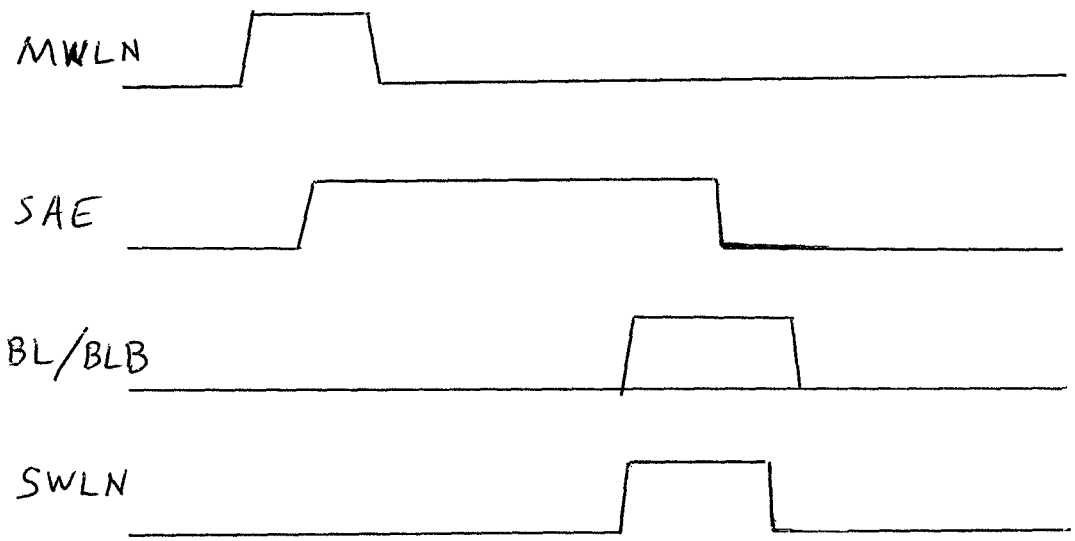
FIG. 16 is a timing diagram of a number of signals used during write and restore operations of the column of FIG. 14, in accordance with one exemplary embodiment of the present invention.

FIG. 16 is a timing diagram of the voltage signals at nodes SWLN, MWLN, BL, BLB, and SAE associated with the cell 600 circuitry of FIG. 14 during a data restore operation method in accordance with one exemplary embodiment of the present invention. In one embodiment the NVM portion of the selected cell have been previously programmed with complementary data to be saved and later restored by this method to the latch portion of the same cell. VCP is held at VCELP/2 throughout this sequence. First the BL and BLB are reset to GND while the SWLN, MWLN and SAE signals are disabled. Then the selected cell's NVM portion is read by pulsing MWLN which charges the BL and BLB signals through the complementary programmed MTJ elements. One of the BL or BLB lines will charge faster than the other and the differential current difference can be sensed by the sense amp when the sense amp is enabled by a timed SAE pulse.

Figure 17:
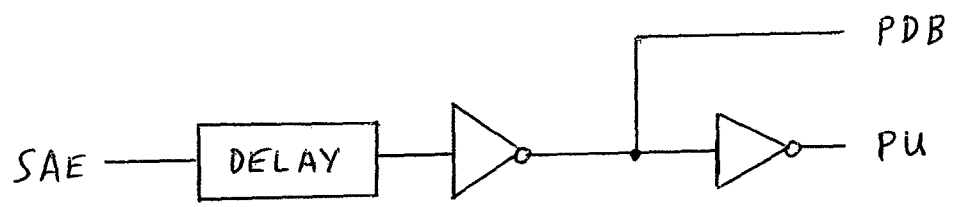
FIG. 17 is a schematic diagram of a write back control circuit, in accordance with one exemplary embodiment of the present invention.

Referring to FIG. 17, which is a schematic diagram of a self timed control circuit for the write back signals PU and PDB, in accordance with one embodiment of the present invention. The self timed control circuit includes a signal delay element coupled to SAE and two inverters. In one embodiment, during the initial sensing period PU and PDB start out low and high respectively due to a low SAE. During the initial sensing period PU and PDB start out low and high respectively due to a low SAE so the write back circuit isolates the BL/BLB from DR/DRB. A SAE delay circuit allows the current sensing operation to convert the differential current on the BL/BLB into a differential voltage of sufficient magnitude to enable reliable regeneration in latch 710. The delay circuit then passes the delayed SAE to the pair of inverters which drive PU and PDB high and low respectively to couple the sense amp's complementary voltage data output on DR/DRB onto the BL/BLB, the data corresponding to that stored earlier in the NVM portion of the cell. The latch 710 also powers up and regenerates the complementary signal on BL/BLB to levels PU and PDB (PDB being driven to GND) that are capable of writing data reliably to the latch 210 in the cell.

Referring back again to FIG. 16, the SAE signal is disabled and the SWLN signal for the selected cell is pulsed to pass the complementary data from BL/BLB to the latch 210 in the selected cell. The signals PDB and PU are thus self timed with the sense amp control timing. Thus, the complementary data previously stored on the NVM portion of the cell has been restored to the latch 210 within the same cell by first being sensed using a current sensing amplifier which converted the data to complementary voltage data. Then, the write back circuit regenerates the signal output from the sense amp to complementary logic levels that are then written to the latch in the selected cell under self timed control by the sense amplifier's control signal.

In another embodiment, the latch portion of a selected one of the multiple non-volatile SRAM memory cells shown in FIG. 14 can be read out and its complementary data stored in the NVM portion of the same cell. This is done in similar fashion as described above in reference to FIGS. 13-17 except MWLN is not pulsed to read the NVM portion of selected cell N, instead, SWLN is pulsed to read the latch portion of selected cell N. Then, complementary data sensing and write back regeneration is done by the sense amp and write back circuits as described above. Then, the MWLN is pulsed to write the complementary data on BL/BLB to the NVM portion of selected cell N using the methods taught above.

In another embodiment the latch portion of a selected one of the multiple non-volatile SRAM memory cells shown in FIG. 14 can be read out and its complementary data stored in the NVM portion of the same cell. This is done in similar fashion as described above in reference to FIGS. 13-17 except SWLN is pulsed to read the latch portion of selected cell N. Then complementary data sensing and write back regeneration is done without the use of the sense amp but, instead, the write back circuit alone serves as a local amplifier and regenerates the complementary data signal supplied to the BL/BLB directly from the latch portion of the selected cell as described above. In this embodiment the polarity orientation of the MTJ elements may be reversed with the FL connected to the select gates (similar to the MTJ element orientation showed in FIG. 9), instead of to the VCP line. Then, the MWLN is pulsed to write the complementary data on BL/BLB to the NVM portion of selected cell N using the methods taught above. The sense amp is enabled by a different control signal (not shown) for use during normal sensing operations when write back and BL/BLB regeneration is not required.

Embodiments of the non-volatile SRAM cell can be used in place of the MRAM cell in the MAT shown in FIG. 7. In one embodiment, the column 500 can be replicated within the MAT 102 such that the SWLN and MWLN lines are connected in common along the row direction. In one embodiment, the sense amp block may be dedicated to each column. In another embodiment, the sense amp block may be shared by multiple columns using a multiplexer or y-decoder as is commonly known in the art of memory chips and as shown in FIG. 7. Read, write and restore operations performed on the non-volatile SRAM cells arranged in the MAT may be accomplished not only on a single cell at a time but on a byte, word, or block of cells at a time as is known in the memory art.

Figure 18:
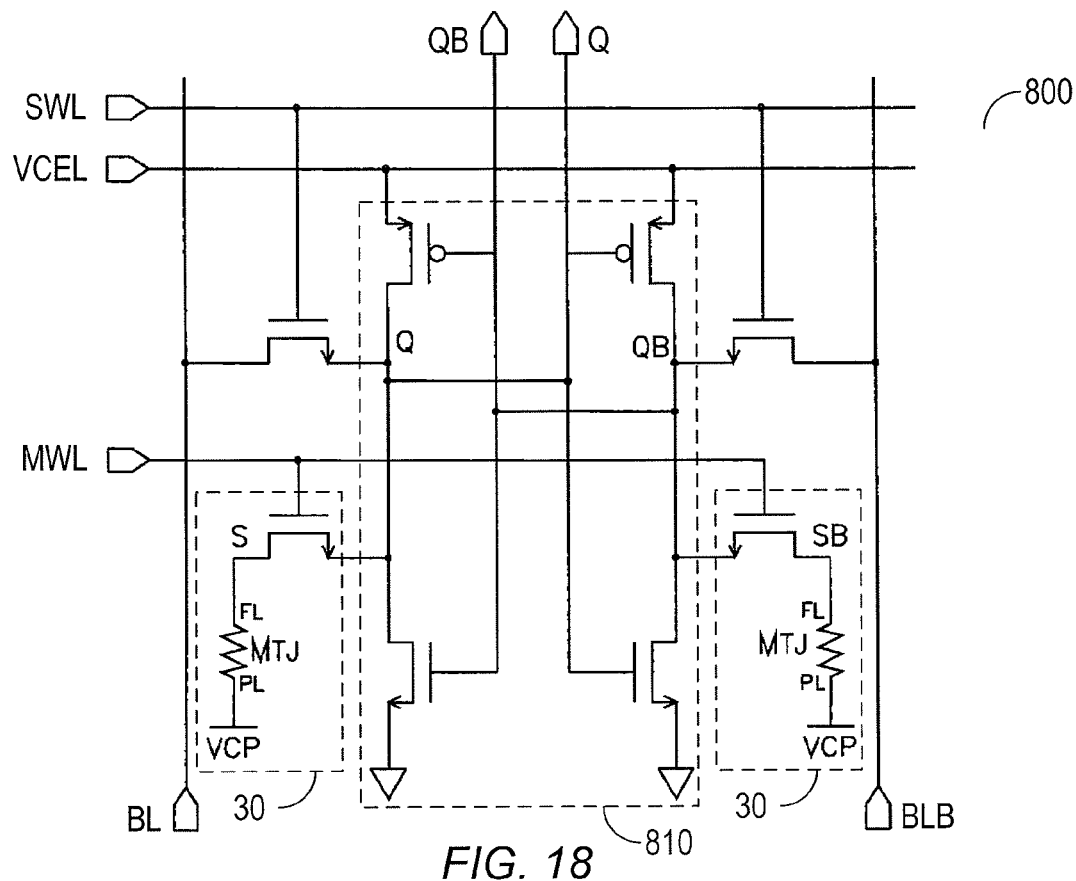
FIG. 18 is a schematic diagram of a non-volatile SRAM register cell circuit, in accordance with one exemplary embodiment of the present invention.

FIG. 18 is a schematic diagram of a non-volatile register cell circuit 800, in accordance with one exemplary embodiment of the present invention. In this embodiment, the cell 800 is similar to the cell 300 shown in FIG. 9, except, the cell 800 in FIG. 18 brings out the nodes Q and QB as outputs of a register. Thus, the drive capability of the inverters in latch 810 in cell 800 may be higher than latch 210 in cell 300. Operation of cell 800 is similar to that described in FIG. 10 for cell 300 except VCP is substituted for SL and SLB. This embodiment can be used for various register based logic circuit block embodiments where it may be desired to preserve the state of a state machine in nonvolatile memory during power disruption or provide very fast loading of register based configurable circuits such as in a FPGA based design. Two examples of such logic circuits embodiments will be discussed, a D flip flop and a FPGA based 4:1 multiplexer. In both these circuits the state of all the registers can be preserved within the same register cell when the power is removed and restored to the registers without having to load data from a source external the cell. This provides much faster system initiation when power is ramped up than previous techniques where data is reloaded into registers from separate memory circuits on or off chip.

Figure 19:
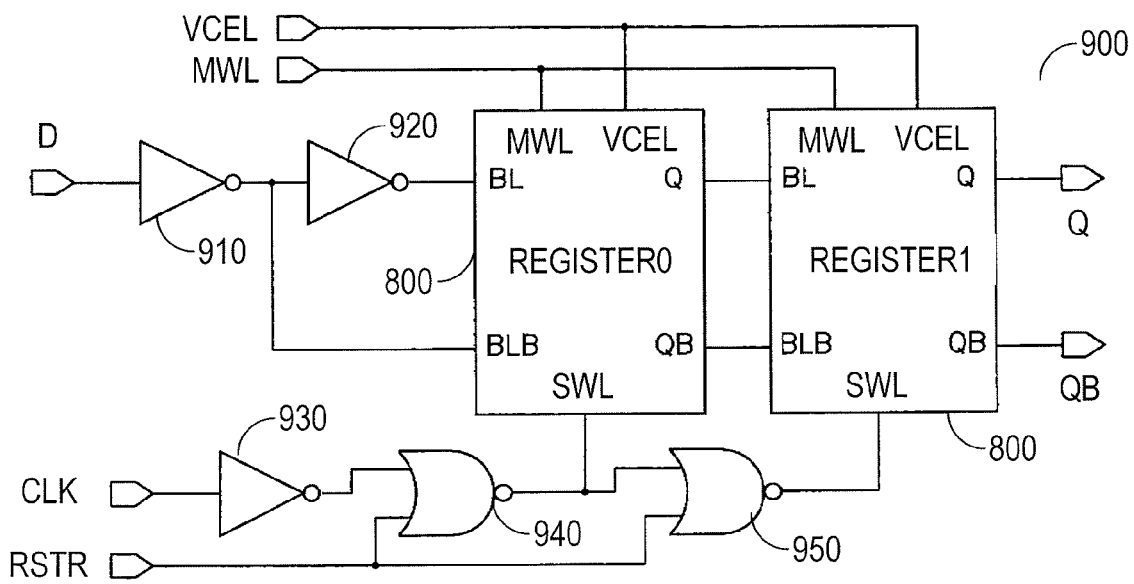
FIG. 19 is a schematic diagram of a non-volatile Drain-type flip flop circuit, in accordance with one exemplary embodiment of the present invention.

FIG. 19 is a schematic diagram of a non-volatile clocked D-type flip flop circuit 900, in accordance with one exemplary embodiment of the present invention. This embodiment includes two register cells 800 marked register0 and register1, three inverters and two NOR gates. In normal logic mode operation RSTR is low. Then the SWL for register0 tracks the CLK signal and SWL for register1 tracks the inverted clock signal since NOR gates 940 and 950 act essentially as inverters when RST is low. When CLK is low, no data can be latched in register0. As the CLK rises, D which was input to BL and DB input to BLB are latched in register0 and output to the BL and BLB inputs of register1 but are not latched there since SWL for register1 is low. When CLK lowers again and completes its first cycle, the D which was latched in register0 is then latched in register1 and output on Q of register1. This satisfy's the characteristic equation for a clocked D-type flip flop which is $Q(t+1)=D$. When RSTR is high, the SWL inputs to both registers are low irrespective of CLK thus suspending operation as a D flip flop. During restore operation, RSTR is high to turn off the latch select transistors so that restore operation can occur normally. Then the state of both register cells can be stored in the NVM portion of the respective same cells and preserved through a power interruption and subsequently restored back to the registers by the same methods described in FIG. 10 by substituting VCP (not shown in FIG. 19) for SL and SLB.

Figure 20:
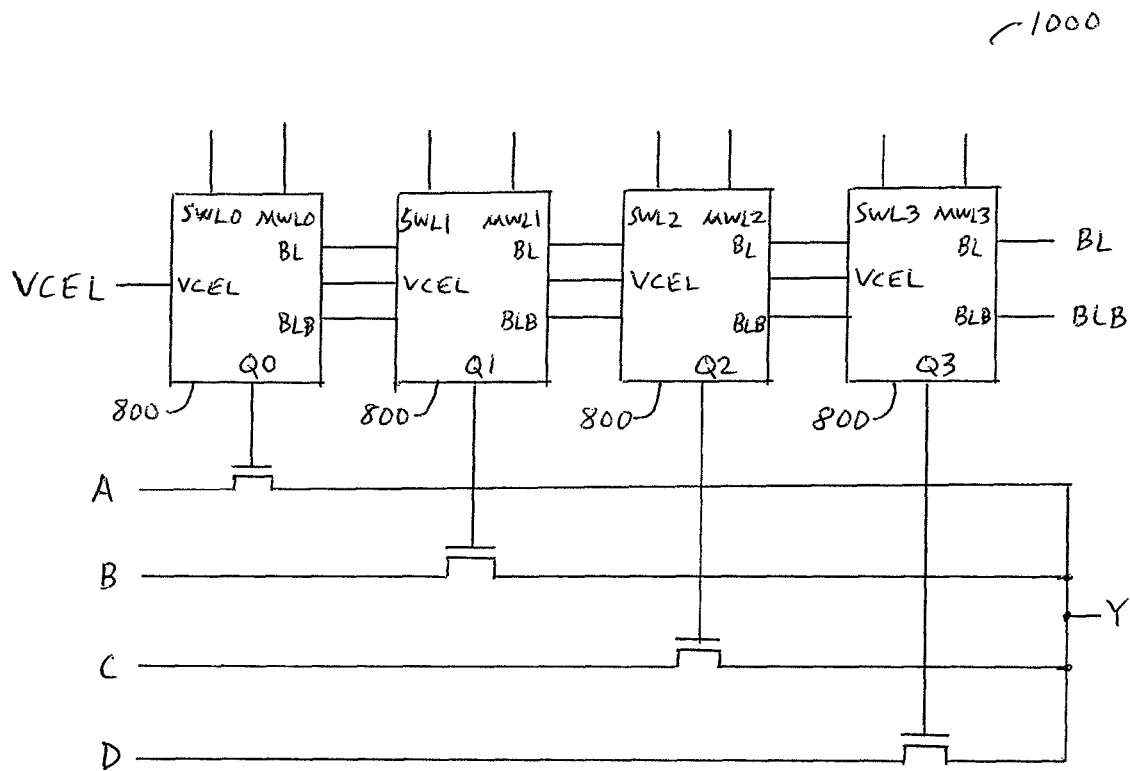
FIG. 20 is a schematic diagram of a non-volatile 4:1 multiplexer circuit, in accordance with one exemplary embodiment of the present invention.

FIG. 20 is a schematic diagram of a non-volatile FPGA based 4:1 multiplexer circuit 1000, in accordance with one exemplary embodiment of the present invention. This embodiment includes four register cells 800 marked with outputs Q0-Q3 each coupled to four respective pass gates. The registers are coupled to a common BL/BLB which can be used by control circuitry (not shown) to load data to the registers that controls the state of each of Q0-Q3. One diffusion end of all four pass gates is coupled to node Y. The remaining diffusion end of the four pass gates are coupled to four inputs A-D, respectively. The input data selected to be passed to Y is controlled by the QN output of the respective register cells, where N=integers 0 through 3. When one of the registers is set (Q=high), the pass gate coupled to that set register is on and the data path between the associated A-D input is coupled to the output Y thus fulfilling the function of a 4:1 multiplexer. Control circuitry may control the SWLN and MWLN lines, coupled to the corresponding registers. The state of all the register cells can be stored in the NVM portion of the respective same cells and preserved through a power interruption and subsequently restored back to the registers by the same methods described in FIG. 10 substituting VCP (not shown in FIG. 20) for SL and SLB.

The above embodiments of the present invention are illustrative and not limitative. Various alternatives and equivalents are possible. The embodiments of the present invention are not limited by the type or the number of the magnetic random access memory cells used in a memory array. The embodiments of the present invention are not limited by the number of layers used to form a magnetic tunnel junction. The embodiments of the present invention are not limited by the voltage levels applied to the magnetic memory cells. Nor are the embodiments of the present invention limited by the NVM circuits being used to read and store complementary data found on a volatile storage element of the same selected memory cell during restore operation. The embodiments of the present invention are not limited by the type of transistor, PMOS, NMOS or otherwise, used to select a magnetic tunnel junction device. The embodiments of the present invention are not limited by the type of integrated circuit in which the present invention may be disposed. Nor are the embodiments of the present invention limited to any specific type of process technology, e.g., CMOS, Bipolar, or BICMOS that may be used to manufacture a magnetic random access memory. The embodiments described herein have been directed to MRAM memory reading and writing circuits but are not limited thereto. The embodiments described herein may be used wherever a storing volatile data in nonvolatile form within the same cell may be found useful.

What is claimed is:

1. A non-volatile static random access memory cell, comprising:
   a bistable regenerative circuit;
   a first transistor comprising a first current carrying terminal coupled to a first terminal of said bistable regenerative circuit, and a second current carrying terminal coupled to a first signal line;
   a second transistor comprising a first current carrying terminal coupled to a second terminal of said bistable regenerative circuit, and a second current carrying terminal coupled to a second signal line;
   a first non-volatile memory cell comprising a first current carrying terminal coupled to said first terminal of said bistable regenerative circuit, a second current carrying terminal coupled to said first signal line, a first magnetic tunnel junction comprising a first terminal coupled to a second current carrying terminal of said first non-volatile memory cell, and a third transistor comprising a first current carrying terminal, a gate terminal and a second current carrying terminal, the first current carrying terminal of the third transistor being coupled to said first current carrying terminal of said first non-volatile memory cell, the gate terminal of the third transistor being coupled to a control terminal of said first non-volatile memory cell and the second current carrying terminal of the third transistor being coupled to a second terminal of said first magnetic tunnel junction; and
   a second non-volatile memory cell comprising a first current carrying terminal coupled to said second terminal of said bistable regenerative circuit, a second current carrying terminal coupled to said second signal line, a second magnetic tunnel junction comprising a first terminal coupled to a second current carrying terminal of said second non-volatile memory cell, and a fourth transistor comprising a first current carrying terminal, a gate terminal and a second current carrying terminal, the first current carrying terminal of the fourth transistor being coupled to said first current carrying terminal of said second non-volatile memory cell, the gate terminal of the fourth transistor being coupled to a control terminal of said second non-volatile memory cell and the second current carrying terminal of the fourth transistor being coupled to a second terminal of said second magnetic tunnel junction, wherein the control terminals of said first and second non-volatile memory cells are coupled to a third signal line and gate terminals of said first and second transistors are coupled to a fourth signal line.

2. The non-volatile static random access memory cell of claim 1 wherein said first and second terminals of said bistable regenerative circuit carry voltage signals that are logic complements of one another, and wherein said first and second signals lines carry voltage signals that are logic complements of one another.

3. The non-volatile static random access memory cell of claim 1 wherein said first and second non-volatile memory cells are at least one of MRAM or STT-MRAM cells.

4. The non-volatile static random access memory cell of claim 1 wherein said bistable regenerative circuit comprises a latch.

5. The non-volatile static random access memory cell of claim 1 further comprising:
   a third transistor having a first current carrying terminal coupled to said second terminal of said bistable regenerative circuit and a second current carrying terminal coupled to a fifth signal line; and
   a fourth transistor having a first current carrying terminal coupled to said first terminal of said bistable regenerative circuit and a second current carrying terminal coupled to said fifth signal line, wherein gate terminals of said third and fourth transistors are coupled to a sixth signal line.

6. The non-volatile static random access memory cell of claim 1 wherein when said first magnetic tunnel junction stores a logical one, said second magnetic tunnel junction stores a logical zero, and when said first magnetic tunnel junction stores a logical zero, said second magnetic tunnel junction stores a logical one.

\* \* \* \* \*